United States Patent [19]
Linder et al.

[11] Patent Number: 5,343,163
[45] Date of Patent: Aug. 30, 1994

[54] SINGLE-ENDED AND DIFFERENTIAL TRANSISTOR AMPLIFIER CIRCUITS WITH FULL SIGNAL MODULATION COMPENSATION TECHNIQUES WHICH ARE TECHNOLOGY INDEPENDENT

[75] Inventors: Lloyd F. Linder, Agora Hills; Dwight D. Birdsall, Norwalk, both of Calif.

[73] Assignee: Hughes Aircraft Company, Los Angeles, Calif.

[21] Appl. No.: 80,269

[22] Filed: Jun. 21, 1993

Related U.S. Application Data

[63] Continuation of Ser. No. 871,861, Apr. 20, 1992, Pat. No. 5,250,911.

[51] Int. Cl.$^5$ ............................................. H03F 3/45
[52] U.S. Cl. ................................................ 330/252
[58] Field of Search ................. 330/149, 252, 261, 69, 330/292

[56] References Cited
U.S. PATENT DOCUMENTS 4,748,420  5/1988  Metz ..................................... 330/149

*Primary Examiner*—Steven Mottola
*Attorney, Agent, or Firm*—Georgann S. Grunebach; Terje Gudmestad; W. K. Denson-Low

[57] ABSTRACT

A compensating transistor (Q5) is connected in series with the collector of a main transistor (Q3), and a level shifted replica (Vin+V1) of an input signal (Vin) is applied to the base of the compensating transistor (Q5) to maintain a constant voltage difference between the base and collector of the main transistor (Q3) and compensate for base width modulation ΔVce. A voltage-controlled current source (S1) is responsive to the input signal (Vin) and applies a compensating current ΔIload which is equal and opposite to the load current variation caused by a change (ΔVin) in the input voltage (Vin) to the emitter of the main transistor (Q3) to compensate for load current modulation ΔVbe. Alternatively, the compensating current can be applied to the junction of the base of the main transistor (Q3) and the emitter of pre-distortion transistor (Q4) which has a base connected to receive the input signal (Vin). Another compensating transistor (Q12) applies a current (ΔIb) which is equal and opposite to a non-linear base current variation to the emitter or collector of the main transistor (Q3) to compensate for current gain modulation ΔIb. The modulation compensation arrangements are applicable to common-collector, common-base and common emitter amplifiers in single-ended and differential configurations, and to substantially all bipolar and field-effect transistor technologies.

4 Claims, 16 Drawing Sheets

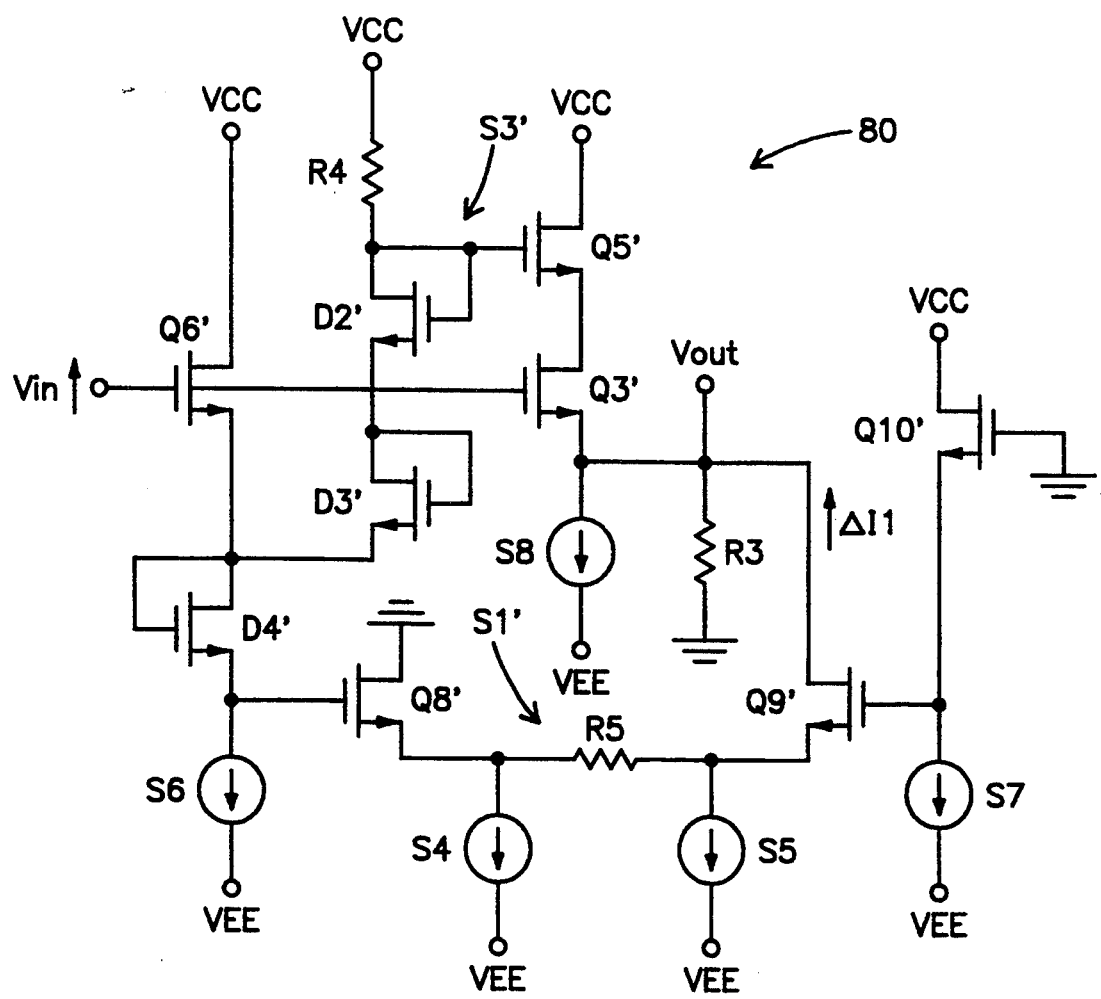
Fig.10
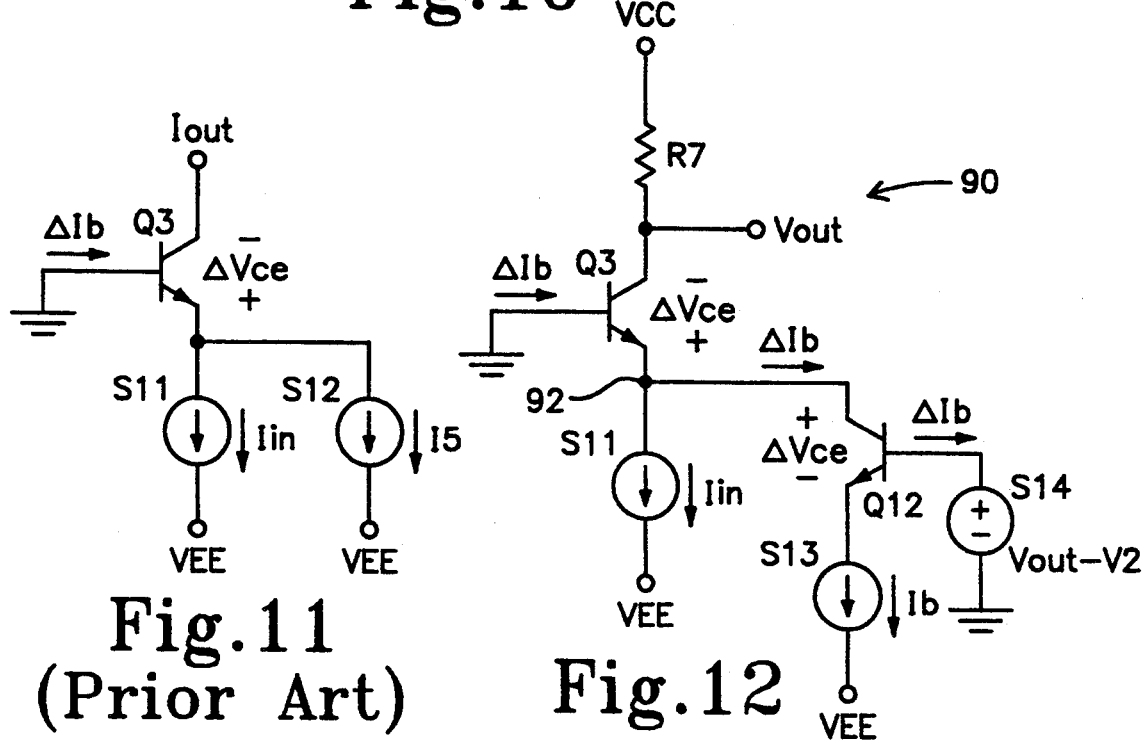
Fig.11
(Prior Art)
Fig.12

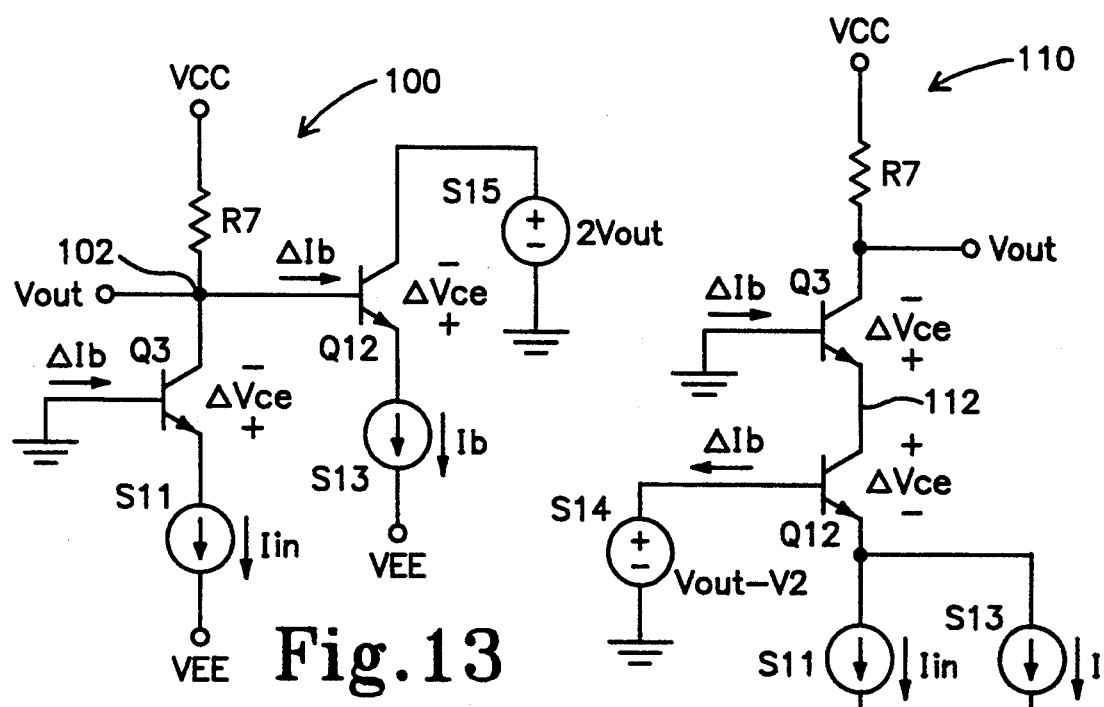
Fig.13
Fig.14
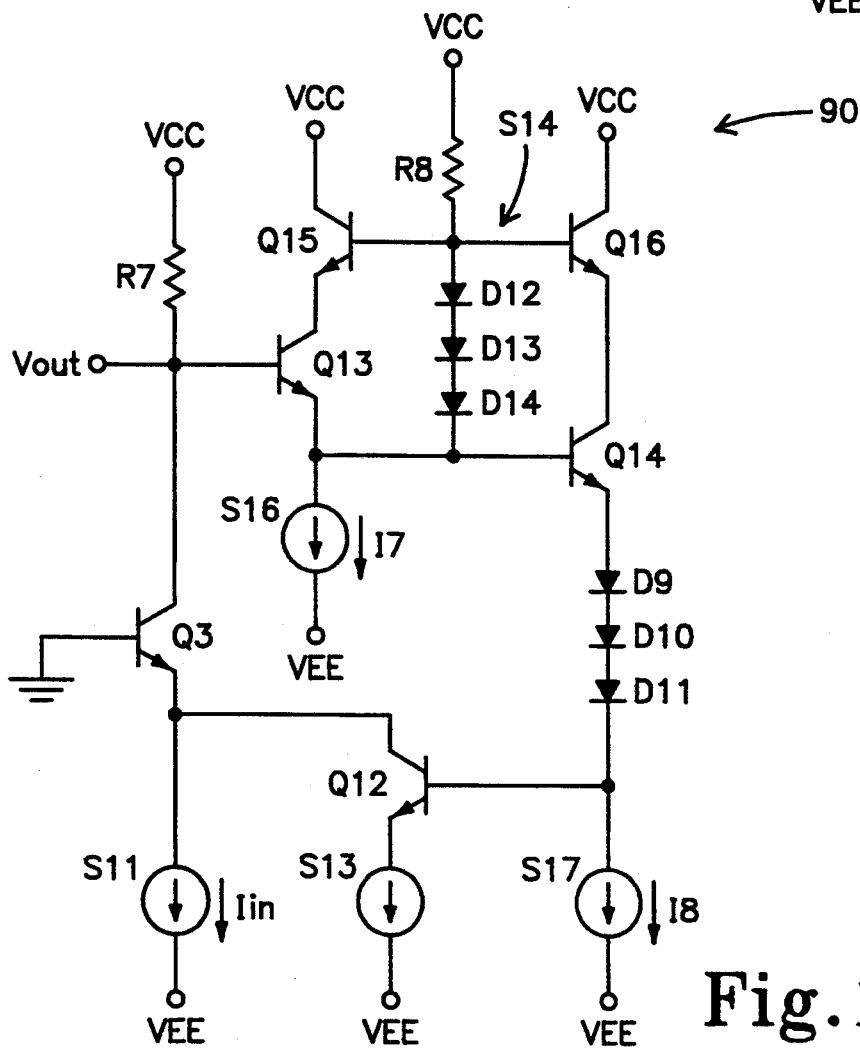
Fig.15

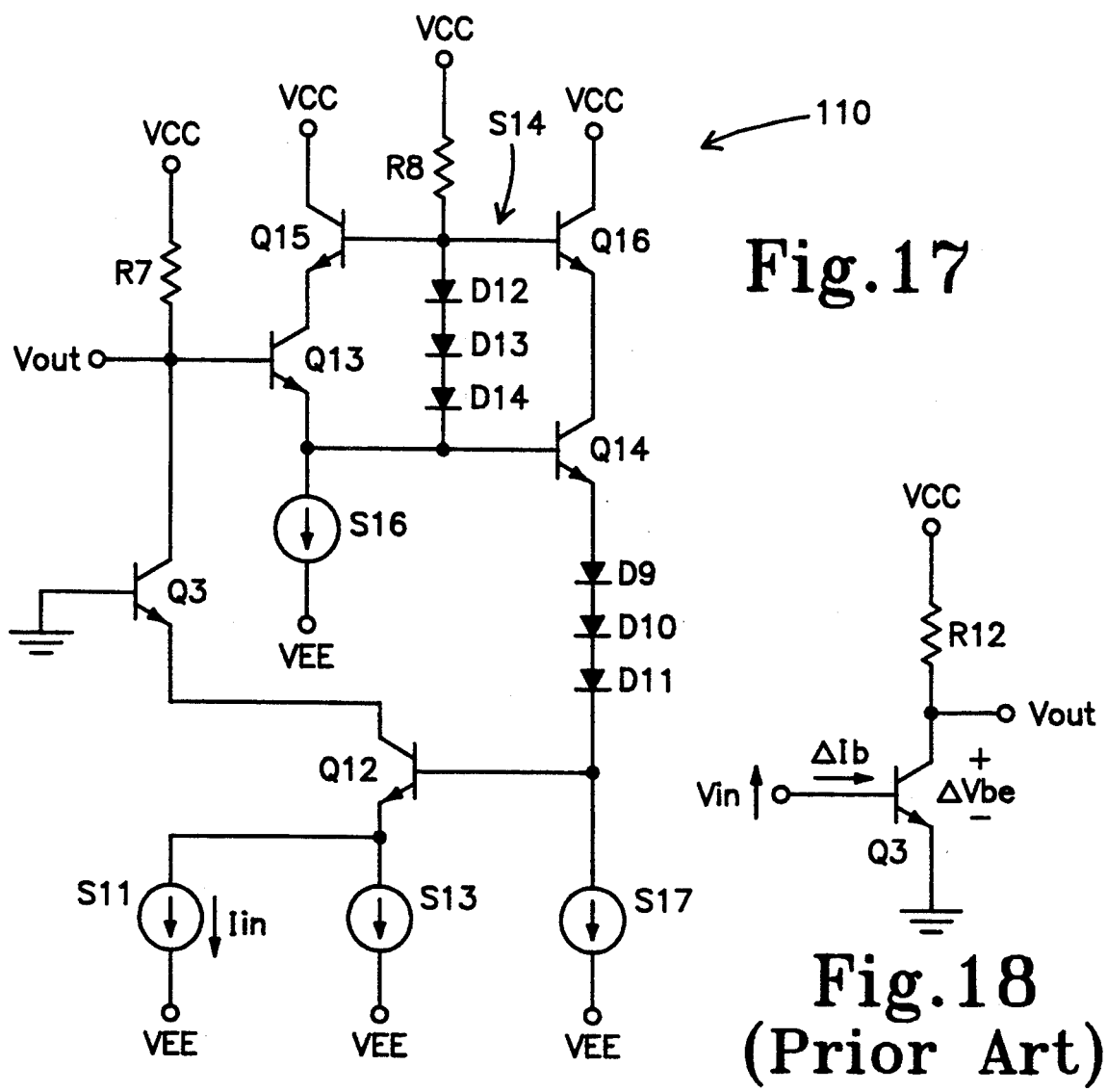
Fig. 17
Fig. 18 (Prior Art)
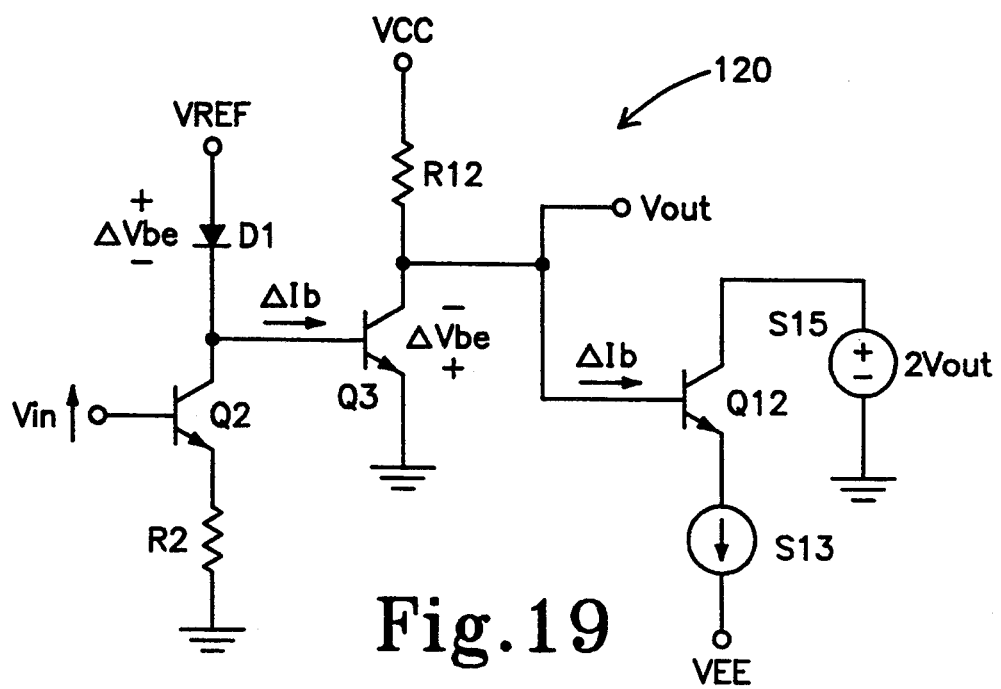
Fig. 19

SINGLE-ENDED AND DIFFERENTIAL TRANSISTOR AMPLIFIER CIRCUITS WITH FULL SIGNAL MODULATION COMPENSATION TECHNIQUES WHICH ARE TECHNOLOGY INDEPENDENT

This is a continuation application of U.S. Ser. No. 07/871,861 filed Apr. 20, 1992, now U.S. Pat. No. 5,250,911 entitled "Single-Ended and Differential Transistor Amplifier Circuits with Full Signal Modulation Compensation Techniques Which Are Technology Independent".

BACKGROUND OF THE INVENTION

1. Field of the Invention

The present invention generally relates to bipolar and field-effect transistor circuits, and more specifically to the compensation of inherent non-linearities in transistor devices to produce single-ended and differential transistor circuits with high linearity and low distortion.

2. Description of the Related Art

Bipolar and field-effect transistors have inherent non-linearities which limit their application. These non-linearities cause modulation of the output signal and distortion.

Negative feedback is commonly employed to increase the linearity of transistor amplifier circuits. However, this technique creates problems of high frequency distortion due to the finite bandwidth of closed loop feedback circuits.

Some of the non-linearities can be canceled through the use of complementary transistor circuits including transistors of both N and P conductivity types. However, complementary transistor circuits fabricated using currently available fabrication techniques are only capable of operation at low speeds. For this reason, prior art high speed transistor circuits include only resistors and transistors of a single conductivity type, usually N, and are vulnerable to non-linear signal modulation.

Variation of the base-emitter current flow in a bipolar transistor causes a variation $\Delta Vbe$ of the forward base-emitter voltage Vbe which in turn causes modulation or distortion of an output signal Vour. Vbe is the voltage drop across the base-emitter junction of the transistor Q1, and is generally on the order of 0.8 volts. Base-emitter current variation will result from the transistor driving a resistive or capacitive load, since the transistor has to source or sink the current flowing through the load.

This effect is known as "load current modulation", and has been compensated for in a common-emitter transistor amplifier as described in a textbook entitled "ANALYSIS AND DESIGN OF ANALOG INTEGRATED CIRCUITS", by P. Gray et al, John Wiley & Sons, 1977, pp. 566–570, and illustrated in FIG. 1. A main NPN type bipolar transistor Q1 is connected in a common-emitter configuration with its emitter grounded and its collector connected to a voltage source VCC through a load resistor R1. The output signal Vour is taken from the collector of the transistor Q1.

If an input signal vin is applied directly to the base of the transistor Q1 and the voltage of the input signal Vin is increased, the collector current will increase by a non-linear (exponential) amount, resulting in a non-linear collector voltage. The operation is opposite for a decrease in the input signal Vin.

The non-linear modulating collector current is compensated for by an NPN type bipolar transistor Q2 having its emitter connected to a voltage source VEE through a resistor R2 and its collector connected to the base of the transistor Q1. The collector of the transistor Q2 is also connected to the cathode of a pre-distortion diode D1, the anode of which is connected to a reference voltage source VREF. The input signal Vin is applied to the base of the transistor Q2. The transistor Q1 and diode D1 are matched such that the junction of the diode D1 has the same voltage-current characteristic as the base-emitter junctions of the transistors Q1 and Q2.

Assuming that the resistance value RV1 of the resistor R2 is very large and the voltage of the input signal Vin is increased by $\Delta Vin$, the collector current of the transistor Q2 will increase by approximately $\Delta I = \Delta Vin/RV1$. The increased current flow through the diode D1 will cause the voltage across the diode D1 to increase by a non-linear (logarithmic) amount $\Delta Vbe$. This causes the voltage at the base of the transistor Q1 to decrease by $\Delta Vbe$. The reduced base voltage causes the base-emitter current of the transistor Q1 to decrease by a non-linear (exponential) amount.

The logarithmic and exponential transformations are mutually canceling, such that the decreased current flow through the base-emitter junction of the transistor Q1 causes the Vbe of Q1 to decrease by $\Delta Vbe$ and the emitter current of the transistor Q1 to decrease by $\Delta I$. The $\Delta Vbe$ of the diode D1 is equal and opposite to and cancels the $\Delta Vbe$ of the transistor Q1, such that the $\Delta Vbe$ of the transistor Q1 does not modulate the output signal Vout.

The arrangement illustrated in FIG. 1 is known in the art as "pre-distortion", since a modulation or distortion which is equal and opposite to the modulation effect in the main transistor is introduced into the signal flow upstream of the main transistor Q1. Although effective, the prior art arrangement of FIG. 1 is limited in that it does not compensate for other non-linear modulation effects.

The effective width of the base region in a bipolar transistor, or the length of the channel region in a field-effect transistor (FET), varies as a non-linear function of the collector-emitter voltage Vce (or the drain source voltage Vds in an FET). This causes modulation $\Delta Vce$ of the collector-emitter voltage Vce of the transistor which distorts the output voltage Vout, and is known as "base-width modulation", "channel-width modulation" or the "Early effect".

Another source of signal modulation which is present in bipolar transistors, but not FETe, is due to the fact that the base current Ib is finite, and varies as a non-linear function of Vce to create a modulating current $\Delta Ib$. This is known as "alpha" error. The current gain can also vary as a non-linear function of collector current, causing modulation known as "current gain modulation" or "beta" error.

SUMMARY OF THE INVENTION

The present invention provides modulation compensation arrangements for transistor circuits which can be used singly or in combination as required to linearize or provide "full signal modulation compensation" for the three basic transistor configurations; common-collector (drain), common-base (gate) and common-emitter (source).

The present techniques are especially suited to an integrated circuit topology in which the devices are of the same conductivity type, e.g. all NPN bipolar transistors or N-channel FETe, to enable high speed operation. However, the present invention is technology-independent, and can be applied to provide enhanced linearity and distortion performance for a wide variety of other types of transistors including complementary bipolar, complementary enhancement/depletion metal-oxide-semiconductor (MOS), enhancement/depletion GaAs, complementary junction field-effect transistor (JFET) and depletion high-electronmobility transistor (HEMT).

In addition to single-ended topologies, the present invention can also be advantageously applied to any analog circuit including, but not limited to, differential amplifiers and specialized circuits such as single-ended to differential converters. In a differential configuration, a circuit embodying the invention can enable main or output transistors to operate with substantially constant current flow, and can double the output current of a conventional differential amplifier.

The transfer functions of basic transistor circuits have various non-linear errors depending on the particular configuration. The present invention includes compensator elements connected in circuit with main transistors, and compensation signal generators which track or are boot-strapped to the input signal and produce and apply compensation signals to the compensator elements as predetermined functions of the input signal such that the compensator elements produce non-linear errors which are substantially equal and opposite to and cancel the non-linear errors of the transistors, and the transistor circuit has a substantially linear transfer function.

The compensating elements include a compensating transistor connected in series with the collector of a main transistor. A level shifted replica of an input signal is applied to the base of the compensating transistor to maintain a constant voltage difference between the base and collector of the main transistor and compensate for base width modulation $\Delta Vce$.

A voltage-controlled current source is responsive to the input signal and applies a compensating current which is equal and opposite to the load current to the emitter of the main transistor to compensate for load current modulation $\Delta Vbe$. Alternatively, the compensating current can be applied to the junction of the base of the main transistor and the emitter of pre-distortion transistor which has a base connected to receive the input signal.

Another compensating transistor is responsive to the input signal and applies a current which is equal and opposite to a non-linear base current variation to the emitter or collector of the main transistor to compensate for current gain modulation $\Delta Ib$.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 10 is similar to FIG. 9, but illustrates the circuit as embodied by N-type metal-oxide-semiconductor (NMOS) FETe;

FIG. 11 illustrates the sources of signal modulation in a common-base bipolar transistor configuration;

FIG. 12 illustrates a common-base transistor circuit embodying the present invention including a first compensation arrangement for current gain ($\Delta Ib$) modulation;

FIG. 13 illustrates a common-base transistor circuit including a second compensation arrangement for $\Delta Ib$ modulation;

FIG. 14 illustrates a common-base transistor circuit including a third compensation arrangement for $\Delta Ib$ modulation;

FIG. 15 illustrates the circuit of FIG. 12 in more detail;

FIG. 17 illustrates the circuit of FIG. 14 in more detail;

FIG. 18 illustrates the sources of signal modulation in a non-degenerated common-emitter bipolar transistor configuration;

FIG. 19 illustrates a non-degenerated common-emitter bipolar transistor circuit embodying the present invention including the compensation arrangements of FIGS. 1 and 13;

DETAILED DESCRIPTION OF THE INVENTION

The present modulation compensation techniques are applicable to substantially all types of transistors, in single-ended and differential configurations. To avoid redundancy, the basic techniques will be described as being applied to NPN bipolar transistors which provide high speed operation and have inherent errors which are more difficult to correct than other types of transistors such as FET devices. The manner in which the techniques must be modified for application to other transistor technologies will then be described as appropriate.

Figure 2:
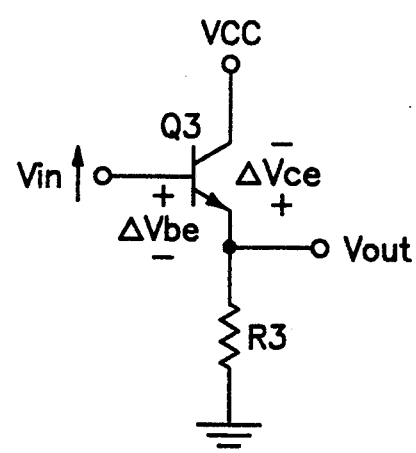
FIG. 2 illustrates the sources of signal modulation in a common collector (emitter-follower) bipolar transistor configuration.

FIG. 2 illustrates the sources of non-linear signal modulation in an NPN type bipolar transistor Q3 which is connected in a common-collector (emitter-follower) configuration, having a collector connected to the source VCC and an emitter connected to ground through a load resistor R3. The input signal Vin is applied to the base of the transistor Q3, whereas the output signal Vout is taken at the emitter thereof.

The transistor Q3 ideally has unity gain, with a transfer function Vout=Vin−Vbe. The dominant non-linear error which causes modulation of the output signal Vout is ΔVbe as described above with reference to FIG. 1. Since the transistor Q3 must source and sink the load current flowing through the resistor R3, the ΔVbe modulation resulting from the load current ie referred to as "load current modulation".

The transistor Q3 is also subject to base width modulation ΔVce or "Early effect". As the voltage of the input signal Vin increases, the collector current of the transistor Q3 increases and the collector-emitter voltage Vce decreases, producing a non-linear effect on the collector current due to the Early effect. This ΔVce variation also causes modulation of the output signal Vout.

Bias voltages and/or currents are applied to transistors in practical circuits. These are generally not relevant to understanding the principles of the invention, and will be disregarded in the following description except where they form an actual part of the invention and their function must be understood.

Figure 3:
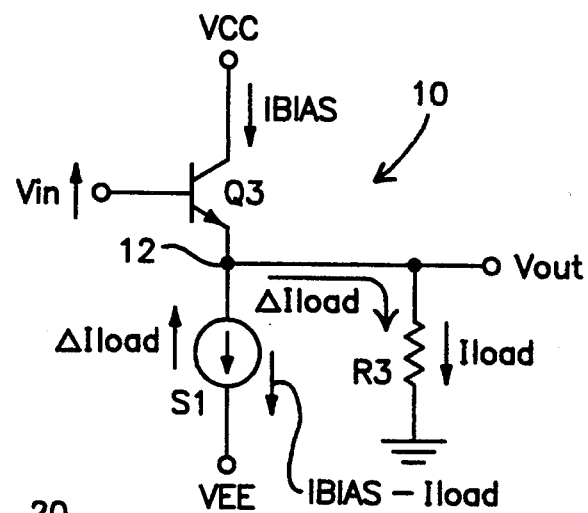
FIG. 3 illustrates a common-collector bipolar transistor circuit embodying the present invention including a first compensation arrangement for $\Delta Vbe$ modulation.

A transistor circuit 10 embodying the present invention which compensates for the non-linear error in the transfer function of the main transistor Q3 resulting from ΔVbe modulation is illustrated in FIG. 3. The load current Iload flowing through the resistor R3 has the value Iload=V/RV3, where V is the voltage across the resistor R3 and RV3 is the resistance of the resistor R3. Without the compensation arrangement of the invention, variation of the load current Iload would cause variation of the current flow out of the emitter of the transistor Q3 and create a non-linear Vbe as described above.

The circuit 10 includes a voltage-controlled current source S1 which is connected between the source VEE and a junction 12 of the emitter of the transistor Q3 and the resistor R3. The source S1 is responsive to the input signal Vin in a feedforward configuration, to the output signal Vout (which tracks the input signal Vin) in a feedback configuration, or to a signal at another point in the circuit 10 which varies with the input signal Vin in a known manner. The source S1 acts as a drain for sinking a variable current out of the junction 12.

Assuming that a bias current which is to be maintained constant through the collector of the transistor Q3 is IBIAS and that the base current of the transistor Q3 is negligibly small compared to the collector current IBIAS, the source S1 sinks a current IBIAS−Iload which varies in accordance with the input signal voltage Vin.

The load current Iload has a value $Iload_0$ for Vin=0. If the input voltage Vin is increased from zero by ΔVin, the voltage at the emitter of the transistor Q3 and thereby across the resistor R3 also increases by ΔVin. The load current Iload through the resistor R3 increases by ΔIload=ΔVin/R3.

The source S1 is controlled in response to the increase in input voltage Vin by ΔVin to decrease the current flow therethrough out of the junction 12 by ΔIload. This is equivalent to causing a compensating signal in the form of a current ΔIload to flow from the source S1 into the junction 12 which is equal to the increased current ΔIload required by the load resistor R3. In this manner, the increased load current is supplied by the source S1 rather than by the transistor Q3. The operation is opposite for a decrease in Vin. It will be noted that the resistor R3 acts as a compensation element in addition to a load resistor, since the compensation current ΔIlload is caused to flow therethrough from the source S1.

The current flow out of the junction 12 through the source S1 is IBIAS−$Iload_0$−ΔIload, and the current flow out of the junction 12 through the resistor R3 is $Iload_0$+ΔIload. The current flow into the junction 12 from the emitter of the transistor Q3 is (IBIAS−$Iload_0$−ΔIload)+($Iload_0$+ΔIload)=IBIAS. In this manner, the current flowing out of the emitter of the transistor Q3 is maintained constant at IBIAS, the base-emitter voltage Vbe of the transistor Q3 is maintained constant, and the source of ΔVbe modulation is eliminated.

Figure 4:
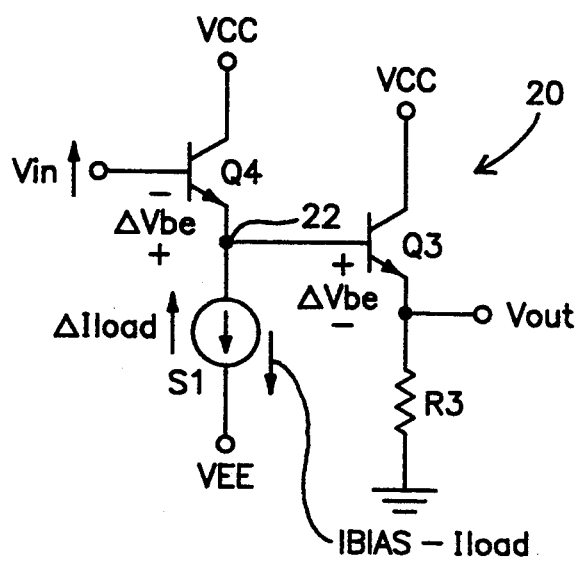
FIG. 4 illustrates a common-collector transistor circuit including a second compensation arrangement for $\Delta Vbe$ modulation.

FIG. 4 illustrates a second compensation arrangement for ΔVbe modulation embodying the present invention, utilizing the principle of pre-distortion which was discussed above. A transistor circuit 20 includes a compensating element in the form of a transistor Q4 having an emitter connected to the base of the transistor Q3 at a junction 22, and a collector connected to the source VCC. The input signal Vin ie applied to the base of the transistor Q4, and the current source S1 is connected to the junction 22.

In the circuit 20, the current through the transistor Q3 is allowed to vary and produce ΔVbe modulation. Assuming that the voltage Vin is increased by ΔVin, the current through Q3 will increase by ΔIload=-ΔVin/RV3 and Vbe will increase by ΔVbe. However, the current source S1 decreases the emitter current of the transistor Q4 by ΔIload such that the Vbe of the transistor Q4 decreases by ΔVbe.

The ΔVbe across the base-emitter junction of the transistor Q4 is equal and opposite to the ΔVbe across the base-emitter junction of the transistor Q3, such that the two variations cancel each other and the voltage difference between the base of the transistor Q4 (input signal Vin) and the emitter of the transistor Q3 (output signal your) is maintained constant.

Figure 1:
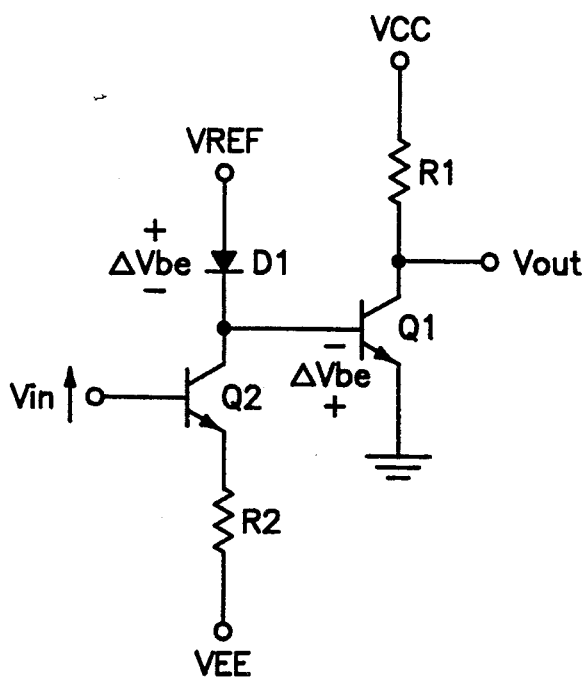
FIG. 1 is an electrical schematic diagram illustrating a prior art common-emitter bipolar transistor circuit including a pre-distortion compensation arrangement for load current ($\Delta Vbe$) modulation.

The circuit 20 uses pre-distortion in a manner which is fundamentally different from the prior art of FIG. 1. The circuit 20 utilizes the transistor Q4 in an emitter-follower configuration as the pre-distorting element, and the source S1 causes a compensating current to flow into the transistor Q4 in a direction which is opposite to the normal current flow of the signal current in the transistor Q3.

Figure 5:
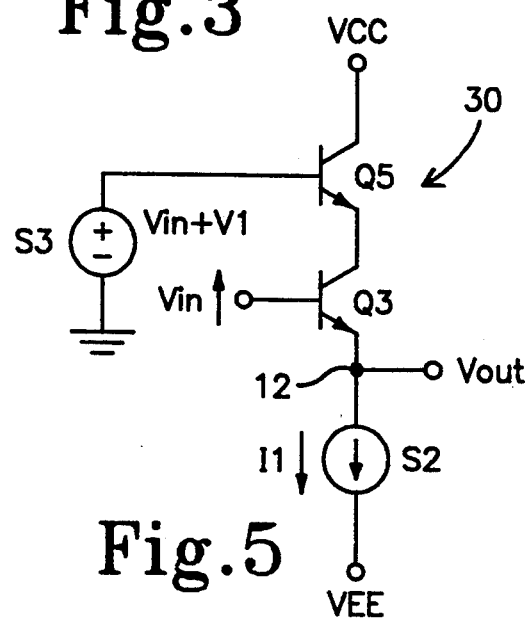
FIG. 5 illustrates a common-collector transistor circuit including a compensation arrangement for base width ($\Delta Vce$) modulation.

The ΔVce modulation is compensated for or eliminated in accordance with the present invention as illustrated in FIG. 5. A transistor circuit 30 includes a compensating element in the form of a transistor Q5 having an emitter connected to the collector of the transistor Q3, a collector connected to the source VCC and a base connected to a voltage-controlled voltage source S3. A constant current source S2 sinks a constant current I1 from the junction 12.

The source S3 is responsive to the input signal Vin, and applies a compensating signal in the form of a voltage Vin+V1 to the base of the transistor Q8. The voltage V1 is constant, and the base of the transistor Q5 is maintained at a constant offset of V1 from the base of the transistor Q3. Assuming that the Vbe of the transistor Q5 is constant, the collector voltage of the transistor Q3 will be maintained at a constant offset of V1−Vbe from the base (Vin) of the transistor Q5.

The emitter of the transistor Q3 will be maintained at a constant offset of Vin−Vbe, and the collector of the transistor Q3 will be maintained at Vin+V1−Vbe. In this manner, the collector-emitter voltage Vce of the transistor Q3 is maintained constant at V1, and the source of ΔVce modulation is eliminated.

Although FIGS. 3 to 5 illustrate arrangements which compensate for only one respective source of non-linearity, the individual compensation techniques can be combined to provide "full signal modulation compensation" as described below.

Figure 6:
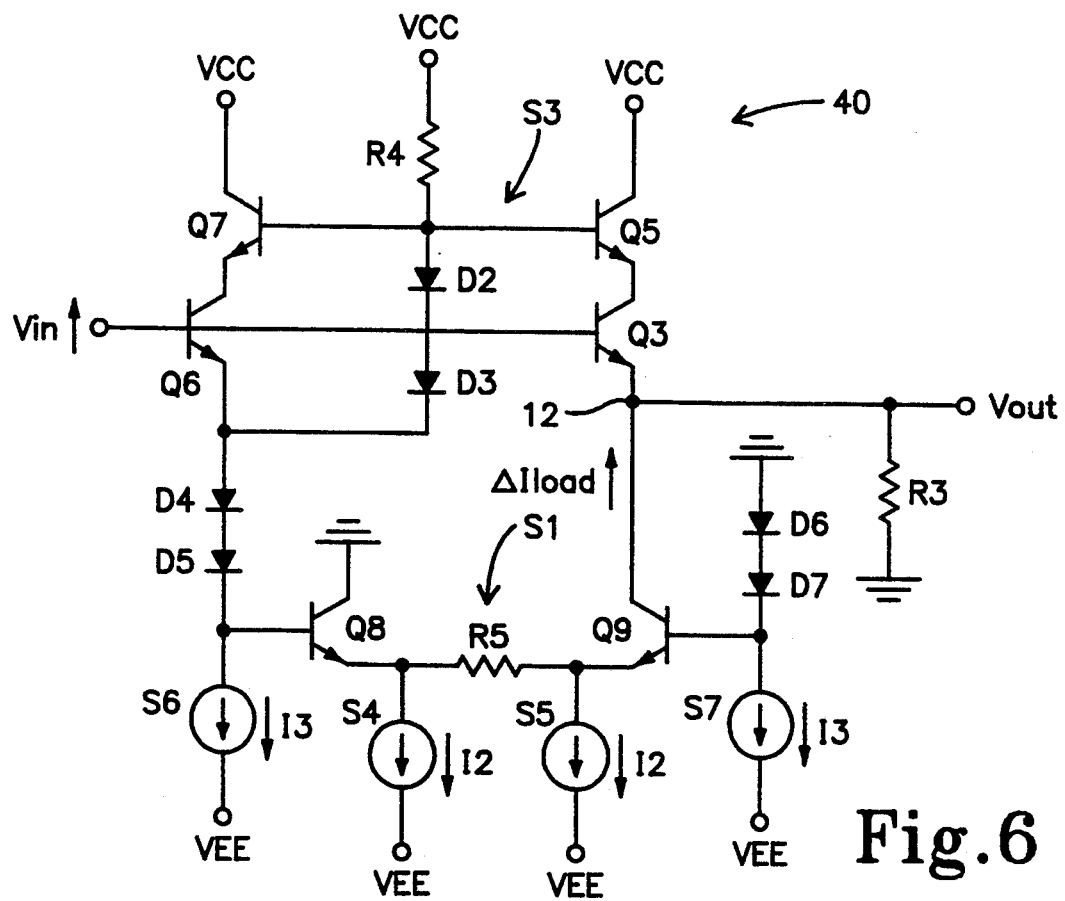
FIG. 6 illustrates a common-collector transistor circuit including the compensation arrangements of FIGS. 3 and 5.

FIG. 6 illustrates a transistor circuit 40 which combines the signal modulation compensation arrangements of FIGS. 3 and 5. The voltage-controlled voltage source S3 includes a transistor Q6 having a base connected to receive the input signal Vin, and level-shifting diodes D2 and D3 which are connected in series between the emitter of the transistor Q6 and the base of the transistor Q5. A resistor R4 is connected between the base of the transistor Q5 and the source VCC.

The voltage at the emitter of the transistor Q6 is one diode drop or unmodulated Vbe (approximately 0.8 volts) below the base of the transistor Q6 (Vin). The voltage at the base of the transistor Q5 is two diode drops (across the diodes D2 and D3) above the emitter of the transistor Q6, or one diode drop above Vin. The voltage at the collector of the transistor Q3 is one diode drop below the base voltage of the transistor Q5, or Vin.

In the circuit 40, the voltage difference between the collector and base of the transistor Q3 is maintained at zero. However, this voltage may be increased to a non-zero value, for example by providing one or more additional diodes in series with the diodes D2 and D3, to reverse bias the collector-base junction of the transistor Q3. This will reduce the collector-base junction capacitance, but also reduce the speed at which the source S3 follows the input signal Vin.

A transistor Q7 has an emitter connected to the collector of the transistor Q6, a collector connected to the source VCC and a base connected to the base of the transistor Q5. The transistor Q7 provides ΔVce compensation for the transistor Q6 in the same manner in which the transistor Q5 provides ΔVce compensation for the transistor Q3.

The voltage-controlled current source S1 includes transistors Q8 and Q9 which have emitters interconnected by an emitter degeneration resistor R5 in a resistively degenerated, differential transconductance amplifier configuration. The collector of the transistor Q8 is grounded, and the collector of the transistor Q9 is connected to the junction 12. Constant current sources S4 and S5 sink equal currents I2 from the respective junctions of the emitters of the transistors Q8 and Q9 and the resistor R5.

Level-shifting diodes D4 and D5 are connected in series between the emitter of the transistor Q6 and the base of the transistor Q8. Level-shifting diodes D6 and D7 are connected in series between ground and the base of the transistor Q9. Constant current sources S6 and S7 sink equal currents I3 from the respective junctions of the bases of the transistors Q8 and Q9 and the diodes D5 and D7.

The resistance of the emitter degeneration resistor R5 is selected to be same as that of the load resistor R3. Due to differential action, as the input voltage Vin increases, the collector current of the transistor Q8 increases and the collector current of the transistor Q9 decreases, each by the same value of ΔIload described with reference to FIG. 3. The reduction of ΔIload in the collector current of the transistor Q9 is equivalent to supplying a compensating current of ΔIload into the junction 12 as described above.

The diodes D4 to D7 shift the voltages at the bases of the transistors Q8 and Q9 to two diode drops below Vin and three diode drops below Vin respectively to match the base voltages of the transistors Q8 and Q9 to a suitable range. However, the level shift in a particular application will depend on the particular topology of the circuit.

Figure 7:
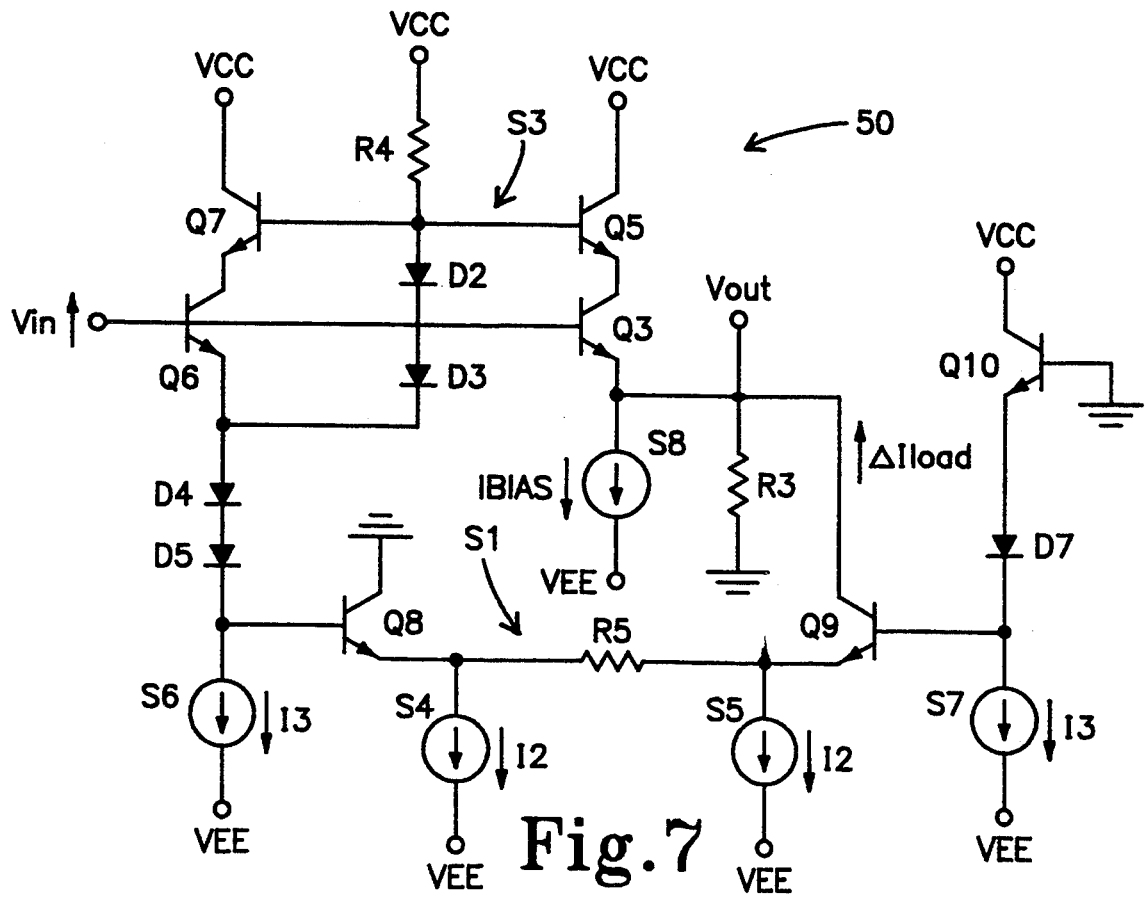
FIG. 7 illustrates a common-collector transistor circuit including a modified embodiment of the compensation arrangements of FIGS. 3 and 5.

FIG. 7 illustrates a modified version of the circuit 40 which is designated as 50. The diode D6 is replaced by a transistor Q10 having an emitter connected to the diode D7, a collector connected to the source VCC and a base connected to ground. The voltage at the base of the transistor Q9 ie therefore two diode drops below ground.

Another constant current source S8 which sinks the current IBIAS as described with reference to FIG. 3 is connected to the junction 12. In this configuration, the bias current for the transistors Q3 and Q5 is sinked by the source S8 as well as the source S5 of the voltage-controlled current source S1.

Figure 8:
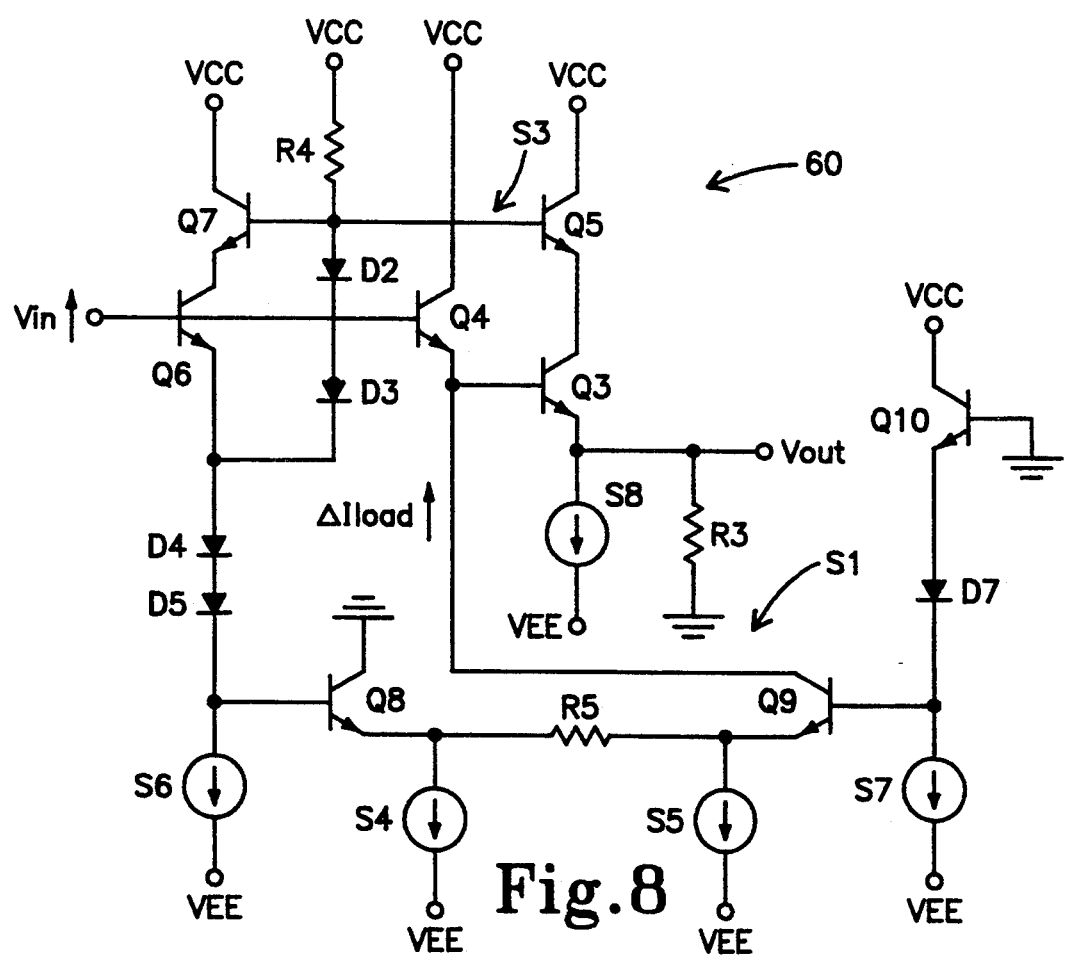
FIG. 8 illustrates a common-collector transistor circuit including the compensation arrangements of FIGS. 4 and 5.

FIG. 8 illustrates another transistor circuit 60 which combines the arrangements of FIGS. 4 and 5. In this case, the collector of the transistor Q9 of the voltage-controlled current source S1 is connected to the emitter of the pre-distortion transistor Q4 as described with reference to FIG. 4. The compensating current $\Delta$Iload supplied from the source S1 to the emitter of the transistor Q4 creates a $\Delta$Vbe in the transistor Q4 which is equal and opposite to and cancels the $\Delta$Vbe of the transistor Q3 as described above.

Figure 9:
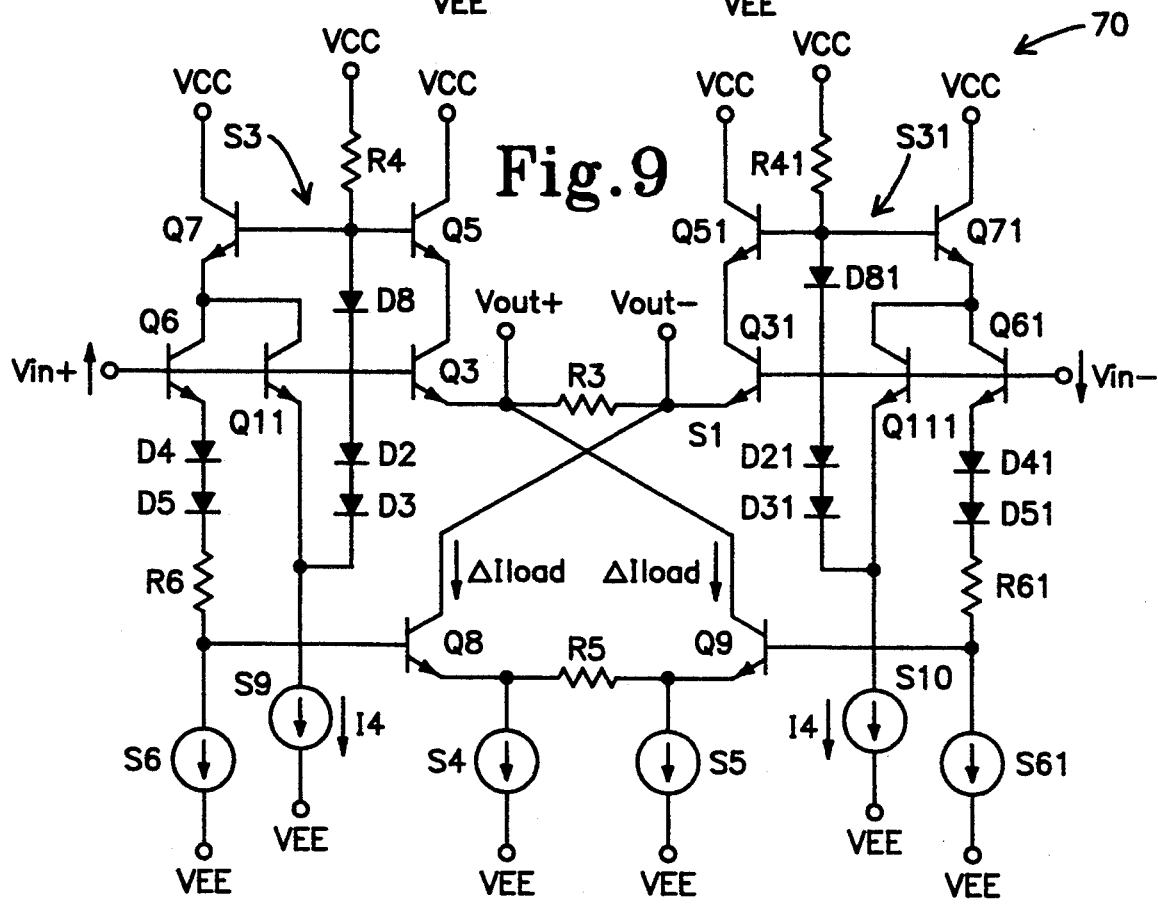
FIG. 9 illustrates a differential common-collector resistively degenerated transistor amplifier circuit including the compensation arrangements of FIGS. 3 and 5.

The present invention is applicable to differential as well as single-ended transistor circuits. FIG. 9 illustrates a differential common-collector resistively degenerated transistor amplifier circuit 70 which is similar to the single-ended circuit of FIG. 7. The left half of the circuit 70 includes elements which are common to those of FIG. 7, and are designated by the same reference numerals. The right half of the circuit 70 includes corresponding elements which are designated by the same reference numerals suffixed by the number "1".

Whereas the transistor Q6 is common to the sources S1 and S3 in FIG. 7, separate transistors Q11 and Q111 and constant current sources S9 and S10 which sink equal currents I4 are provided for the sources S3 and respectively. Additional diodes DS and DS1 are connected in series with the diodes D2,D3 and D21,D31, and resistors R6 and R61 are connected in series with the diodes D4,D5 and D41,D51 respectively.

The differential input signal consists of two voltage level signals Vin+ and Vin− which are applied to the bases of the transistors Q3,Q6,Q11 and Q31,Q61,Q111 respectively. The load resistor R3 is connected between the emitters of the transistors Q3 and Q31 and constitutes an emitter degeneration resistor for the differential pair Q3,Q31. The output signal consists of two voltage level signals Vout+ and Vout− which appear at the emitters of the transistors Q3 and Q31 respectively. The collector of the transistor Q8 is connected to the emitter of the transistor Q31, and the collector of the transistor Q9 is connected to the emitter of the transistor Q3 in a cross-coupled arrangement.

The symmetry of the differential configuration enables a single voltage-controlled current source S1 to supply equal and opposite compensating currents $\Delta$Iload for the transistors Q3 and Q31 and thereby compensate for $\Delta$Vbe modulation. As the signals Vin+ and Vout+ increase and the signals Vin− and Vout− decrease, the collector current of the transistor Q8 increases and the collector current of the transistor Q9 decreases. The change in current flow through the resistor R3 is such that the transistor Q5 sinks $\Delta$Iload from the right end of the resistor R3 and the transistor Q9 sources $\Delta$Iload into the left end of the resistor R3, thereby supplying the required load current for R3.

The present modulation compensation techniques are applicable to substantially all types of transistors. FIG. 10 illustrates a transistor circuit 80 which is similar to the circuit 50 of FIG. 7, except that the transistors are NMOS rather than bipolar. Corresponding but modified elements are designated by the same reference numerals primed.

The diodes D2,D3 and D4,D5 are replaced by diode-connected transistors designated as D2′, D3′ and D4′ respectively. It will be noted that there is no element corresponding to the transistor Q7. This is because the transistor Q6′ does not draw base current, and it is not necessary to maintain its drain-gate voltage Vdg constant. However, the main transistor Q3′ does require a constant Vdg as provided by Q5′, since channel width modulation ($\Delta$Vds) produces a non-linear gate-source modulation $\Delta$Vgs. Since the transfer function of a source-follower includes non-linear Vgs terms, Vds must be maintained constant over the range of the input voltage Vin.

FIG. 11 illustrates the dominant non-linear error in the transfer function of the bipolar transistor Q3 connected in a common-base configuration. Current gain modulation $\Delta$Ib, also known as "alpha error", results from the fact that the base current in a bipolar transistor is finite and varies as a non-linear function of the collector-emitter voltage Vce.

Since there is no gate current flow in an FET, there is no corresponding gate current or $\Delta$Ig modulation. Although $\Delta$Vds modulation causes a corresponding $\Delta$Vgs modulation, this does not affect the current transfer function in a common-gate FET circuit, since the current gain is unity.

$\Delta$Vbe modulation is not relevant in the common-base configuration since the transfer function includes only currents. However, $\Delta$Vce modulation is present and is actually a cause of $\Delta$Ib modulation. If there are beta changes as the input signal current changes, there is an additional $\Delta$Ib modulation. The technique for compensating for $\Delta$Vce modulation is the same as in the common-collector case described above.

In the common base configuration, the input signal is applied from a signal source S11 to the emitter of the transistor Q3 as an input current Iin, and the transfer function is Iout/Iin or Vout/Iin. A constant current source S12 sinks a constant bias current I5 from the emitter of the transistor Q3. As the input current Iin increases by $\Delta$Iin, the collector-emitter voltage Vce and the output voltage rout decrease by $\Delta$Vce if the collector of the transistor Q3 is loaded with a resistive load. If not, then $\Delta$Ib due to non-linear beta will cause a $\Delta$Ib modulation. This causes a corresponding non-linear increase $\Delta$Ib in the current Ib flowing into the base of the transistor Q3 and $\Delta$Ib modulation of the output signal Vout.

A transistor circuit 90 including a compensating arrangement for base current modulation $\Delta$Ib is illustrated in FIG. 12, and includes a compensating transistor Q12 having a collector connected to the emitter of the transistor Q3 at a junction 92. The emitter of the transistor Q12 is connected to a constant current source S13 which sinks a current I6. The base of the transistor Q12 is connected to a voltage-controlled voltage source S14 which generates a compensating signal in the form of a voltage Vout−V2, where V2 ie a constant offset. The collector of the transistor Q3 is connected to the source VCC through a load resistor R7.

As the input current Iin increases by $\Delta$In, the output voltage Vout and the voltage at the base of the transistor Q12 decrease by $\Delta$Vce, and the collector-emitter voltage Vce of the transistor Q3 decreases by $\Delta$Vce. This $\Delta$Vce causes the base current of the transistor Q12 to decrease by $\Delta$Ib, and the collector current of the transistor Q12 to increase by the same amount. Since the collector of the transistor Q12 is connected to the emitter of the transistor Q3 at the junction 92, the increase in current flow out of the junction 92 through the collector of the transistor Q12 cancels the increase in current flow into the junction 92 through the emitter of the transistor Q3, and the source of ΔIb modulation is compensated for or eliminated.

FIG. 13 illustrates a transistor circuit 100 including a second compensation arrangement for ΔIb modulation. In this case, the base of the compensating transistor Q12 is connected to a junction 102 of the collector of the transistor Q3 and the load resistor RT. The emitter of the transistor Q12 is connected to the source S13 and the collector of the transistor Q12 is connected to a voltage-controlled voltage source S15 which produces a compensating signal 2Vout having twice the voltage of the output signal Vout.

As the input current Iin increases by ΔIn and the voltage Vce of the transistor Q3 decreases by ΔVce, the voltage at the base of the transistor Q12 decreases by ΔVce. However, the voltage applied to the collector of the transistor Q12 decreases by 2ΔVce. As a result, the collector-emitter voltage Vce of the transistor Q12 decreases by ΔVce and the base current increases by ΔIb.

Since the base of the transistor Q12 is connected to the collector of the transistor Q3 at the junction 102, the increase in current flow out of the junction 102 through the base of the transistor Q12 cancels the increase in current flow into the junction 102 through the collector of the transistor Q3 in a manner similar to the circuit 90.

The ΔIb compensation arrangements of FIGS. 12 and 13 are effective in applications where the current gain of the transistor Q3 is constant over the range of input current Iin. However, in some applications the current gain is a non-linear function of the input current. A circuit 110 illustrated in FIG. 14 effectively compensates for current gain modulation or "beta" error as well as for the "alpha" error resulting from ΔVce modulation.

In FIG. 14, the transistor Q12 has its collector connected to the emitter of the transistor Q3 at a junction 112 as in the circuit 90 of FIG. 12. However, in this case, the input signal source S11 is connected to the emitter of the transistor Q12 rather than to the emitter of the transistor Q3.

The collector current of the transistor Q12 decreases by ΔIb to cancel the increase in base current of the transistor Q3 at the junction 112 in the manner described above with reference to FIG. 12. However, since the signal current Iin flows through both transistors Q3 and Q12, the current gain in the transistors varies by equal and opposite amounts which are mutually canceling, such that current gain modulation or beta error is compensated for or eliminated.

The circuit 90 of FIG. 12 is illustrated in more detail in FIG. 15. The voltage-controlled voltage source S14 includes a transistor having a base connected to receive the output signal Vout and an emitter connected to a constant current source S16 which sinks a current I7. The emitter of the transistor Q13 is also connected to the base of a transistor Q14, the emitter of which is connected to the base of the transistor Q12 through level shifting diodes D9, D10 and D11. The base of the transistor Q12 is also connected to a constant current source S17 which sinks a current I8.

The emitter of the transistor Q13 is also connected to the bases of bootstrap transistors Q15 and Q16 through level shifting diodes D12, D13 and D14. The collectors of the transistors Q15 and Q16 are connected to the source VCC. The emitters of the transistors Q15 and Q16 are connected to the collectors of the transistors Q13 and Q14 respectively. A resistor RS is connected between the bases of the transistors Q15 and Q16 and the source VCC.

The Vbe drops across the transistors Q13 and Q14 and diodes D9, D10 and D11 maintain the voltage at the base of the transistor Q12 five diode drops below Vout. Thus, V2=5Vbe. The transistors Q15 and Q16 compensate the transistors Q13 and Q14 for ΔVce modulation in the manner described above with reference to FIG. 5. The diodes D12, D13 and D14 level shift the output signal rout such that the collectors of the transistors Q13 and Q14 are maintained one diode drop above their bases. The transistor Q14 provides isolation of the transistor Q13 from the transistor Q12 such that the output voltage Vout is not modulated by the ΔIb of the transistor Q12.

Figure 16:
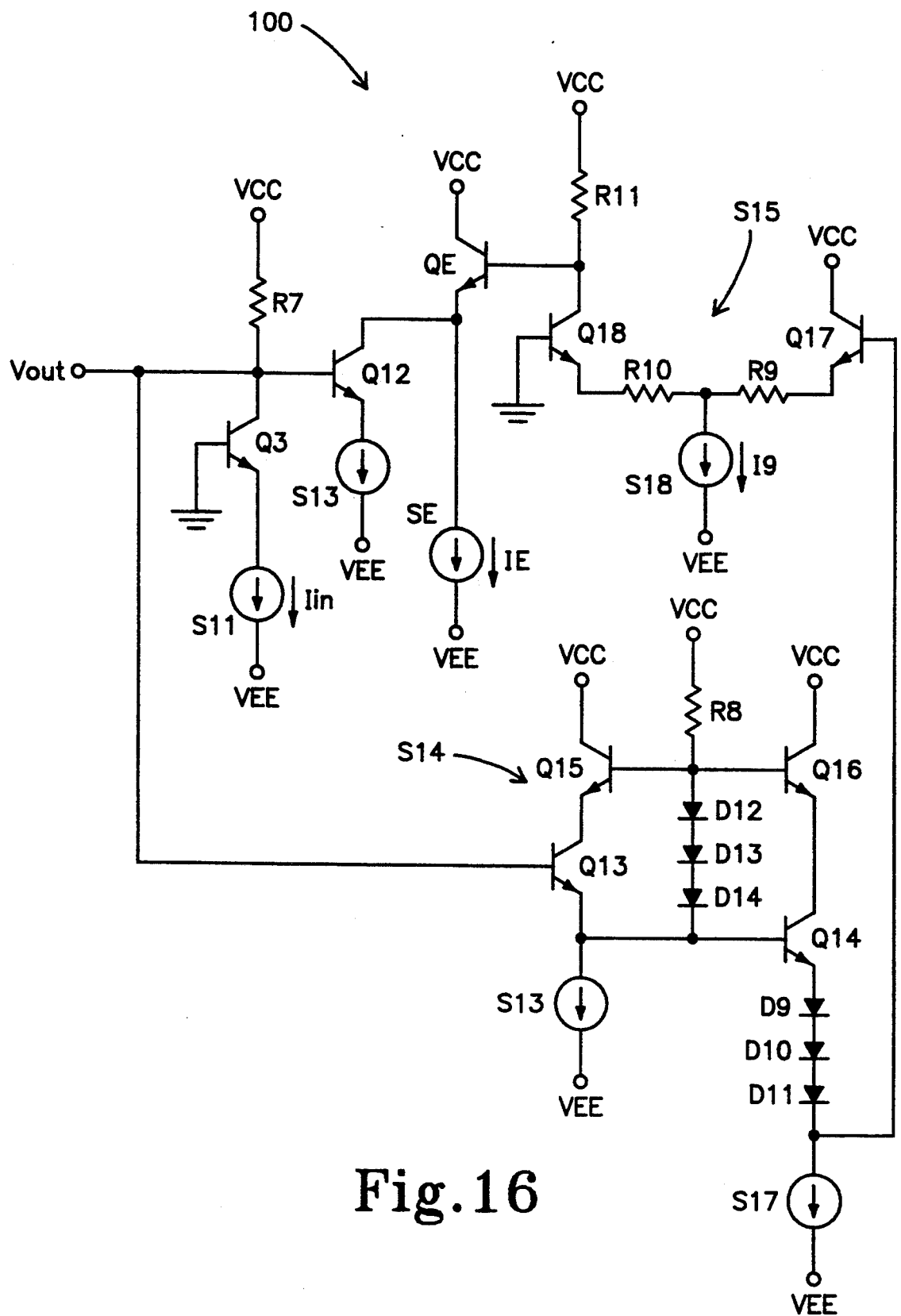
FIG. 16 illustrates the circuit of FIG. 13 in more detail.

The circuit 100 of FIG. 13 is illustrated in more detail in FIG. 16. The voltage-controlled voltage source S15 includes the source S14 described above with reference to FIG. 15. The junction of the diode D11 and source S17 is connected to the base of a transistor Q17, the collector of which is connected to the source VCC and the emitter of which is connected through emitter degeneration resistors R9 and R10 to the emitter of a transistor Q18.

The junction of the resistors R9 and R10 is connected to a constant current source S18 which sinks a current I9. The base of the transistor Q18 is connected to ground and the collector of the transistor Q18 is connected to the source VCC through a resistor R11. The collector of the transistor Q18 is also connected to the base of an emitter-follower buffer transistor QE, the collector of which is connected to the source VCC.

The emitter of the transistor QE is connected to the collector of the transistor Q12, and also to a constant current source SE which sinks a current IE. The resistances of the resistors R9 and R10 are selected to be equal. The resistance of the resistor R11 is four times the resistance of resistors R9 and R10.

The transistors Q17 and Q18 are connected in a resistively degenerated transconductance differential amplifier configuration. As the output voltage rout increases, the voltage at the base of the transistor Q17 increases and the current through the transistor Q17 increases. The current through the transistor Q18 decreases and the voltage at the collector of the transistor Q18 increases. Due to the ratio of the resistances of the resistors R9, R10 and R11, the voltage at the collectors of the transistors Q18 and Q12 increases by twice as much as Vout to provide the required voltage 2Vout.

The circuit 110 of FIG. 14 is illustrated in more detail in FIG. 17. The configuration of the voltage-controlled voltage source S14 is the same as in FIGS. 15 and 16.

FIG. 18 illustrates the sources of non-linear signal modulation in the transfer function of the transistor Q3 connected a non-degenerated common-emitter configuration. The emitter of the transistor Q3 is connected to ground, and the collector is connected to the source VCC through a load resistor R12. The input signal Vin is applied to the base of the transistor Q3. The transfer function is Vout/Vin or Iout/Vin. The dominant non-linear error is ΔVbe, with ΔVce and ΔIb errors present to a lesser extent. Although some internal emitter resistance is present in a real transistor, it will be assumed to be zero in the non-degenerated common-emitter configuration.

FIG. 19 is a simplified diagram illustrating a transistor circuit 120 in which the ΔVbe and ΔIb errors are compensated for using the arrangements of FIGS. 1 and 13 in combination. The individual compensation arrangements function in the manner described above.

Figure 20:
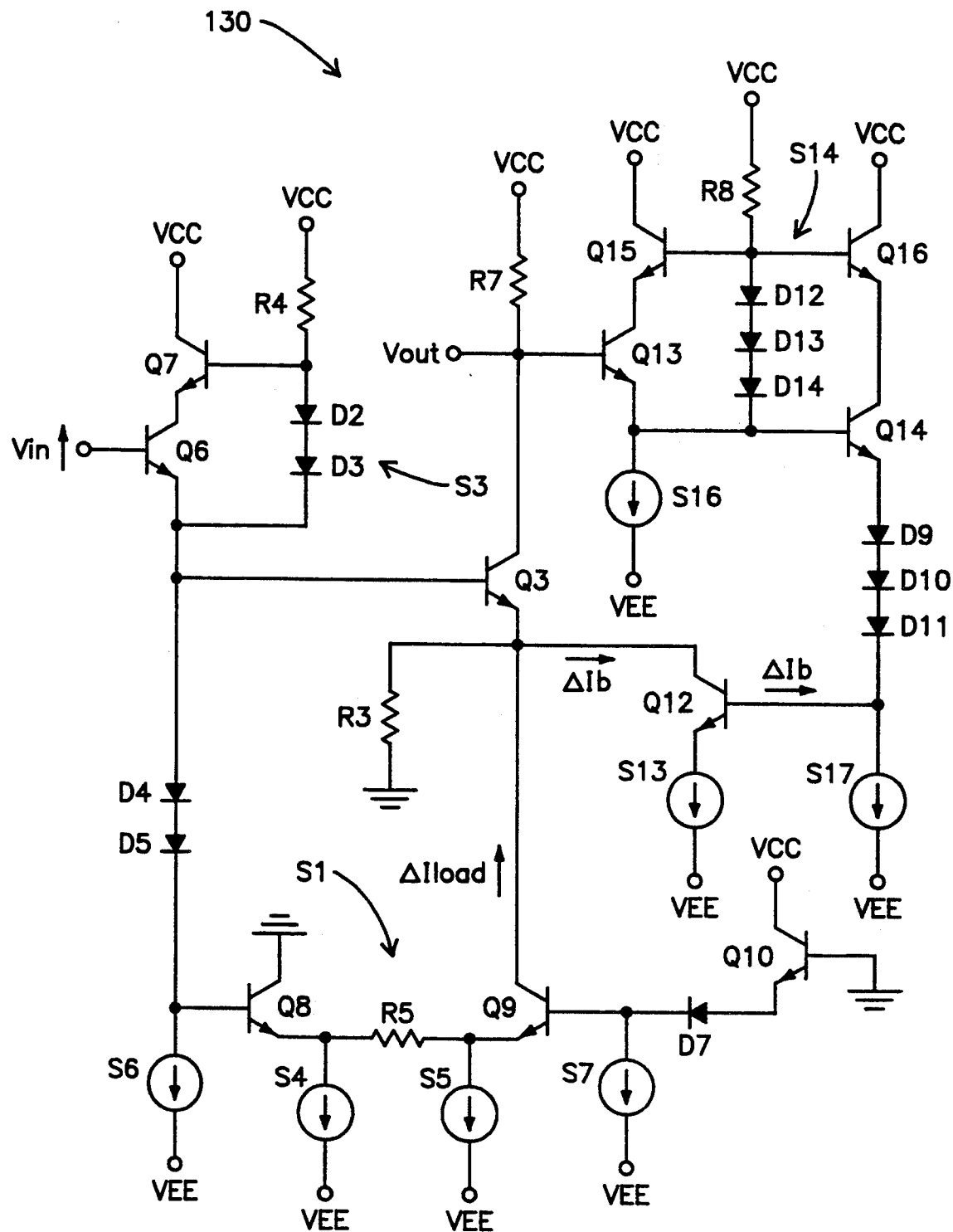
FIG. 20 illustrates a resistively degenerated common-emitter bipolar transistor circuit including the compensation arrangements of FIGS. 3 and 12.

If an emitter degeneration resistor is provided in a common-emitter configuration such as indicated at R3 in FIG. 20, a transistor circuit 130 can include the modulation compensation arrangements described above for the common-collector configuration and common-base configuration. $\Delta$Vbe compensation is provided by the source S1 and resistor R3 as described above with reference to FIGS. 3 and 6. $\Delta$Ib compensation due to $\Delta$Vce is provided by the transistor Q12 and voltage-controlled voltage source S14 as described above with reference to FIGS. 12 and 15.

Figure 21:
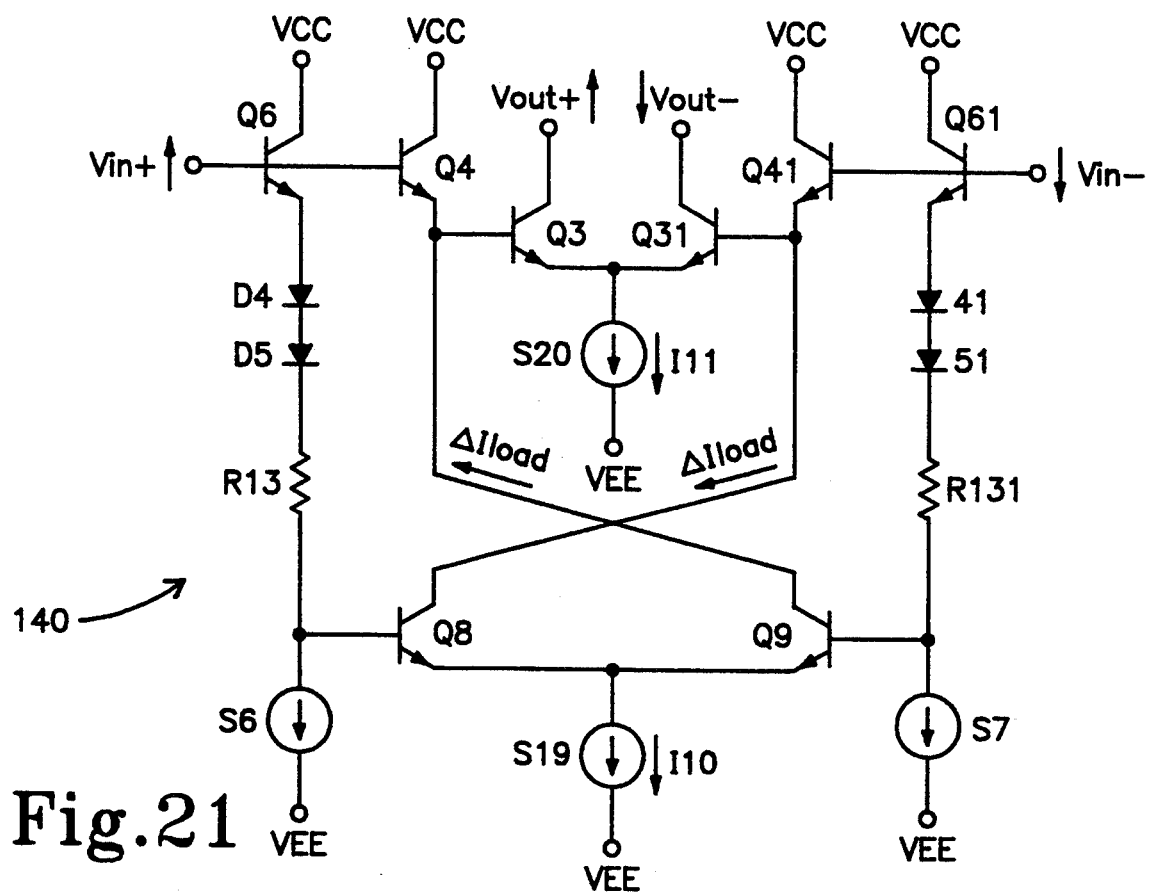
FIG. 21 illustrates a non-degenerated common-emitter bipolar transistor differential transconductance amplifier in a feedforward configuration including the $\Delta Vbe$ compensation arrangement of FIG. 4.

FIGS. 21 to 27 illustrate further examples of how the present signal modulation compensation arrangements can be applied to transistors in a differential configuration. FIG. 21 illustrates a non-degenerated common-emitter bipolar transistor differential transconductance amplifier circuit 140 including pre-distortion $\Delta$Vbe compensation as described above with reference to FIGS. 4 and 6.

The left half of the circuit 140 includes elements which are common to those of FIG. 6, and are designated by the same reference numerals. The right half of the circuit 140 includes corresponding elements which are designated by the same reference numerals suffixed by the number "1".

Resistors R13 and R131 are connected in series with the diodes D4,D5 and D41,D51 respectively. The emitters of the transistors Q8 and Q9 are connected to a constant current source S19 which sinks a current I10. The emitters of the transistors Q3 and Q31 are connected to a constant current source S20 which sinks a current I11.

The circuit 140 has a "feedforward" configuration, with the input to the compensating arrangement being the differential input signal. The signals Vin+ and Vin− are level shifted and applied to the bases of the transistors Q8 and Q9 respectively through the transistors Q6,Q61, diodes D4,D5 and D41,D51 and resistors R13 and R131 respectively. As the signal Vin+ increases and the signal Vin− decreases, the output current Iout+ of the transistor Q3 increases and the output current Iout− of the transistor Q31 decreases. The Vbe of Q3 increases by $\Delta$Vbe and the Vbe of Q31 decreases by $\Delta$Vbe.

The collector current of the transistor Q8, which flows through the pre-distortion compensating transistor Q41, increases, causing the Vbe of the transistor Q41 to increase by $\Delta$Vbe to compensate for the decrease of Vbe in the transistor Q31. Analogously, the collector current of the transistor Q9, which flows through the pre-distortion compensating transistor Q4, decreases, causing the Vbe of the transistor Q4 to decrease by $\Delta$Vbe to compensate for the increase of Vbe in the transistor Q3. Equivalently, a compensating current $\Delta$Iload flows from the transistor Q9 into the transistor Q4, and a compensating current $\Delta$Iload flows out of the transistor Q41 into the transistor Q8.

Figure 22:
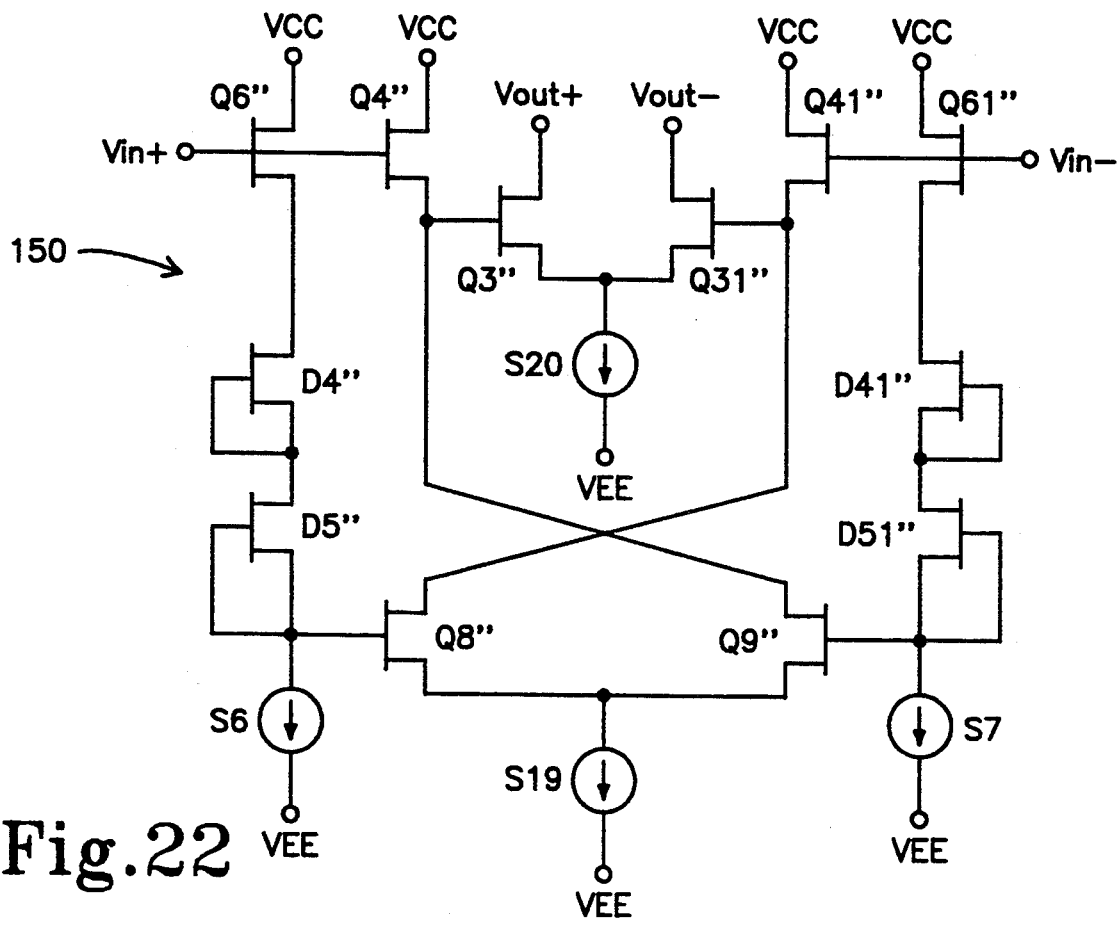
FIG. 22 is similar to FIG. 21, but illustrates the circuit as embodied by HEMTs.

FIG. 22 illustrates a transistor circuit 150 which is similar to the circuit 140 of FIG. 21, except that the transistors are HEMTs rather than bipolar. Corresponding but modified elements are designated by the same reference numerals double primed.

Figure 23:
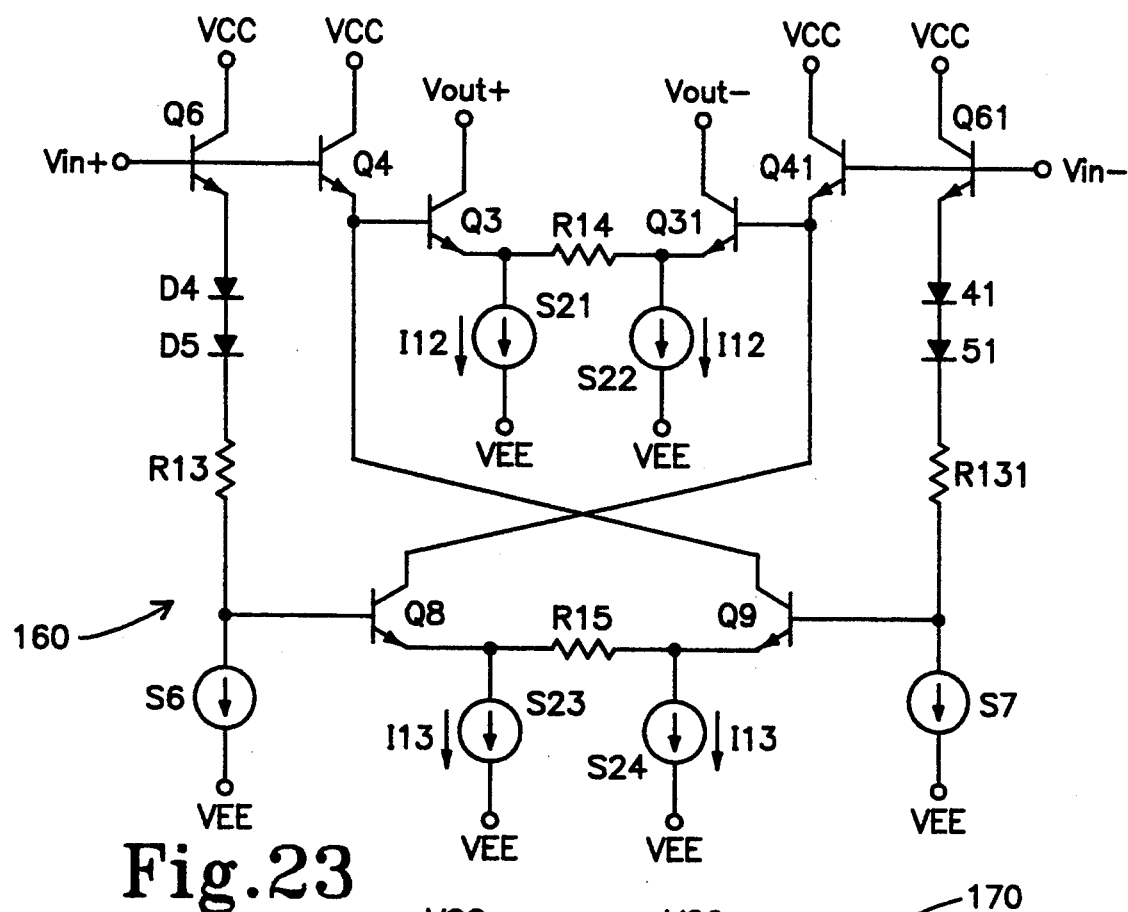
FIG. 23 illustrates a resistively degenerated common-emitter bipolar transistor differential transconductance amplifier in a feedforward configuration including the $\Delta Vbe$ compensation arrangement of FIG. 4.

FIG. 23 illustrates a resistively degenerated common-emitter bipolar transistor differential transconductance amplifier circuit 160 which is similar to the circuit 140 of FIG. 21 except that emitter degeneration resistors R14 and R15 are connected between the emitters of the transistors Q3,Q31 and Q8,Q9 respectively. Constant current sources S21 and S22 which sink currents I12 are connected to the emitters of the transistors Q3 and Q31, and constant current sources S23 and S24 which sink currents I13 are connected to the emitters of the transistors Q8 and Q9 respectively.

Figure 24:
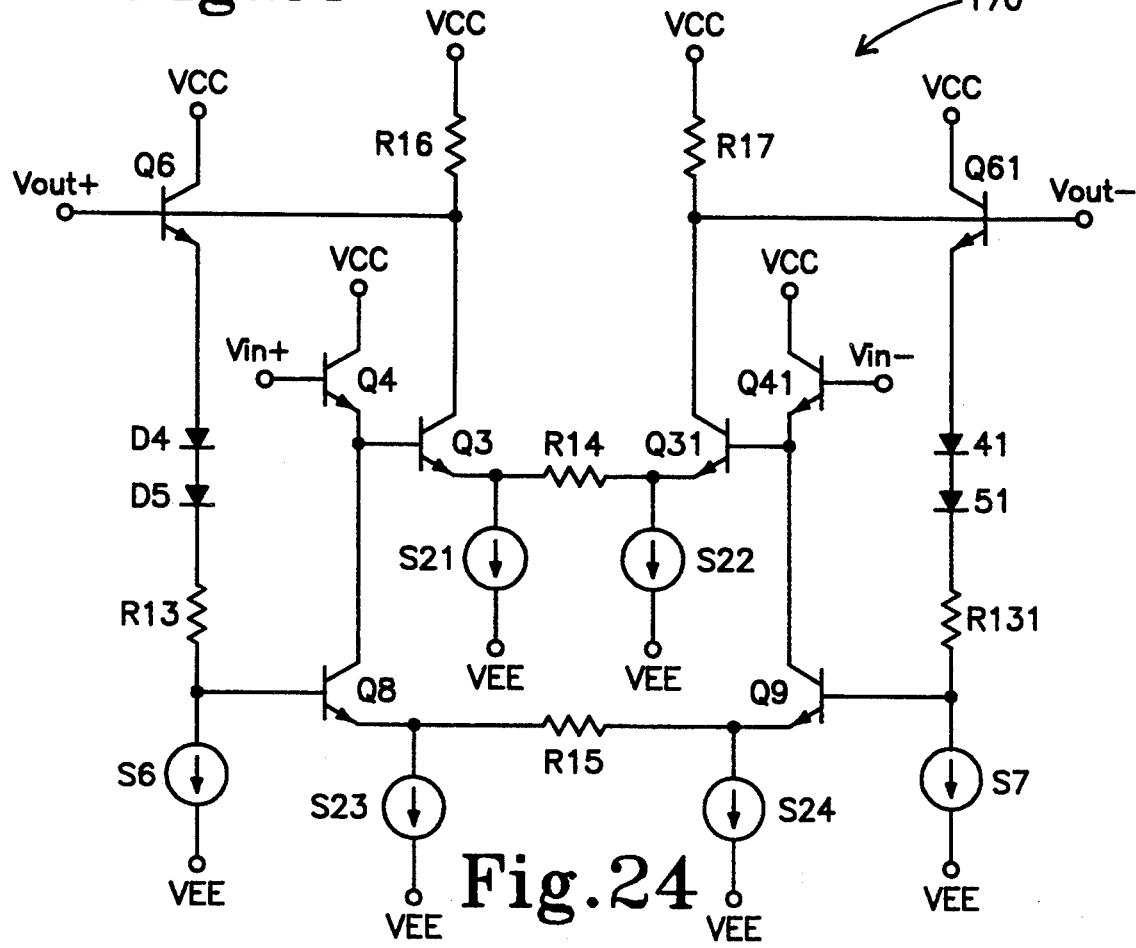
FIG. 24 illustrates a resistively degenerated common-emitter bipolar transistor differential transconductance amplifier in a resistive load, feedback configuration including the ΔVbe compensation arrangement of FIG. 4.

FIG. 24 illustrates a resistively degenerated common-emitter bipolar transistor differential transconductance amplifier circuit 170. The circuit 170 differs from the circuit 23 in that output signal is taken as differential voltages Vout+ and Vout− across load resistors R16 and R17 which are connected between the collectors of the transistors Q3 and Q31 and the source VCC. In addition, the input for the compensating arrangement is the output signal, rather than the input signal as in FIG. 23. This is known as a "feedback" configuration. The bases of the transistors Q6 and Q61 are connected to the collectors of the transistors Q3 and Q31 respectively.

Figure 25:
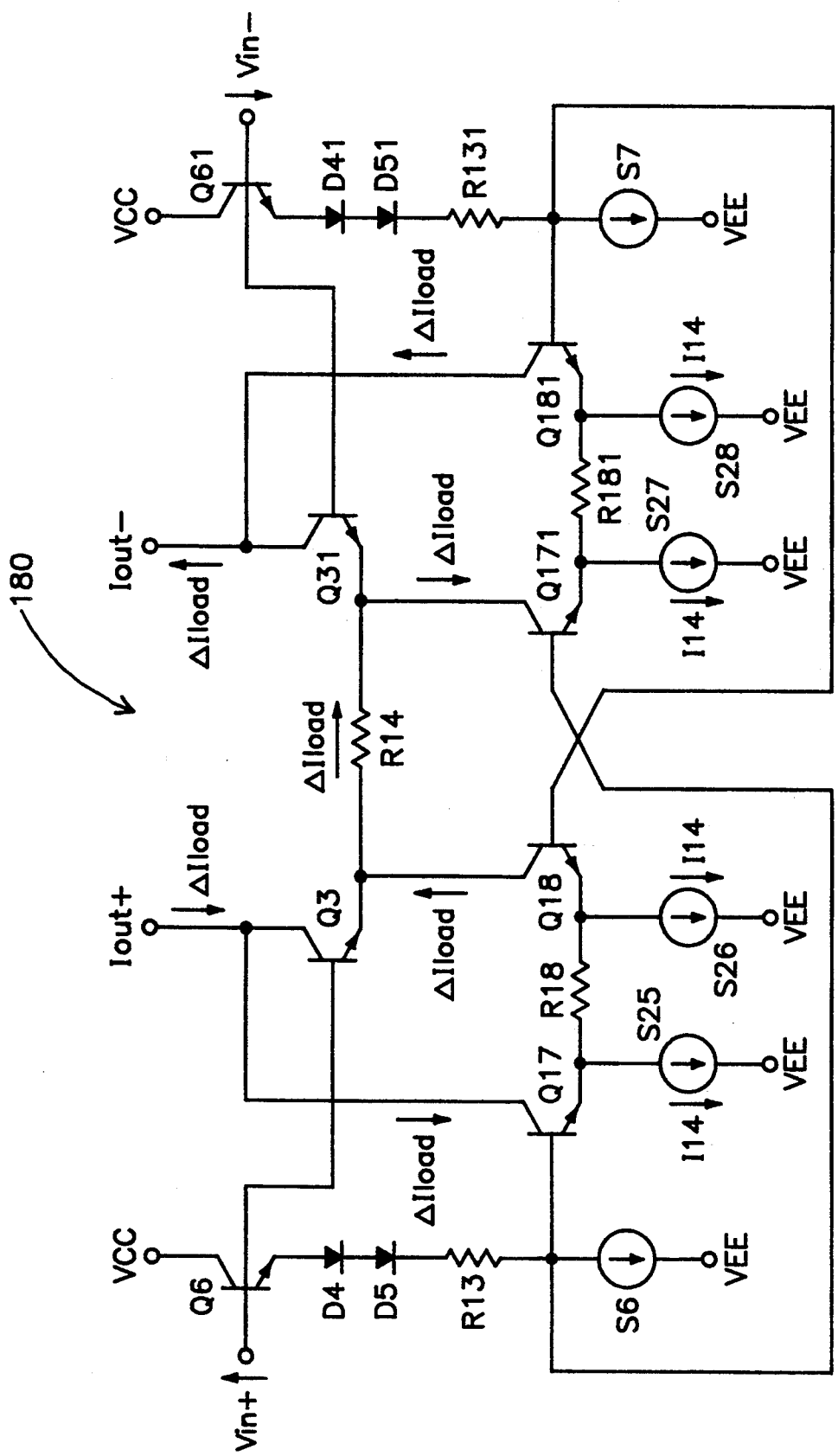
FIG. 25 illustrates another resistively degenerated common-emitter bipolar transistor differential transconductance amplifier in a feedforward configuration including the ΔVbe compensation arrangement of FIG. 3.

FIG. 25 illustrates another resistively degenerated common-emitter bipolar transistor differential transconductance amplifier circuit 180 in a feedforward configuration. The circuit 180 utilizes the $\Delta$Vbe compensation arrangement described with reference to FIG. 3, and differs from the circuits described above in that the compensation arrangement supplies all of the load current variation $\Delta$Iload, with no $\Delta$Iload flowing through the main transistors Q3 and Q31. Thus, the main transistors Q3 and Q31 operate with substantially constant current.

A transistor Q17 has a collector connected to the collector of the transistor Q3, an emitter connected to a constant current source S25 which sinks a current I14 and a base connected to the junction of the resistor R13 and source S6. A transistor Q18 has a collector connected to the emitter of the transistor Q3, an emitter connected to a constant current source S26 which sinks the current I14 and a base connected to the junction of the resistor R131 and source S7. An emitter degeneration resistor R18 is connected between the emitters of the transistors Q17 and Q18.

A transistor Q171 has a collector connected to the emitter of the transistor Q31, an emitter connected to a constant current source S27 which sinks the current I14 and a base connected to the junction of the resistor R13 and source S6. A transistor Q181 has a collector connected to the collector of the transistor Q31, an emitter connected to a constant current source S28 which sinks the current I14 and a base connected to the junction of the resistor R131 and source S7. The resistors R14, R18 and R181 have the same value.

When Vin+ increases and Vin− decreases, the collector current of the transistor Q17 increases by $\Delta$Iload such that the $\Delta$Iload at the collector of the transistor Q3 is sinked by the transistor Q17 rather than flowing into the collector of the transistor Q3. The collector current of the transistor Q18 decreases such that such that the $\Delta$Iload at the emitter of the transistor Q3 is sourced by the transistor Q18 rather than flowing out of the emitter of the transistor Q3.

Similarly, the collector current of the transistor Q171 increases by $\Delta$Iload such that the $\Delta$Iload at the emitter of the transistor Q31 is sinked by the transistor Q171 rather than flowing into the emitter of the transistor Q31. The collector current of the transistor Q18 decreases such that such that the $\Delta$Iload at the collector of the transistor Q31 is sourced by the transistor Q181 rather than flowing out of the collector of the transistor Q31.

In this manner, the transistor Q18 sources, and the transistor Q171 sinks the ΔIload current for the resistor R14, the transistor Q17 sinks and the transistor Q181 sources the output ΔIload current, and no ΔIload current flows through the main transistors Q3 and Q31, therefore effectively compensating for ΔVbe modulation.

Figure 26:
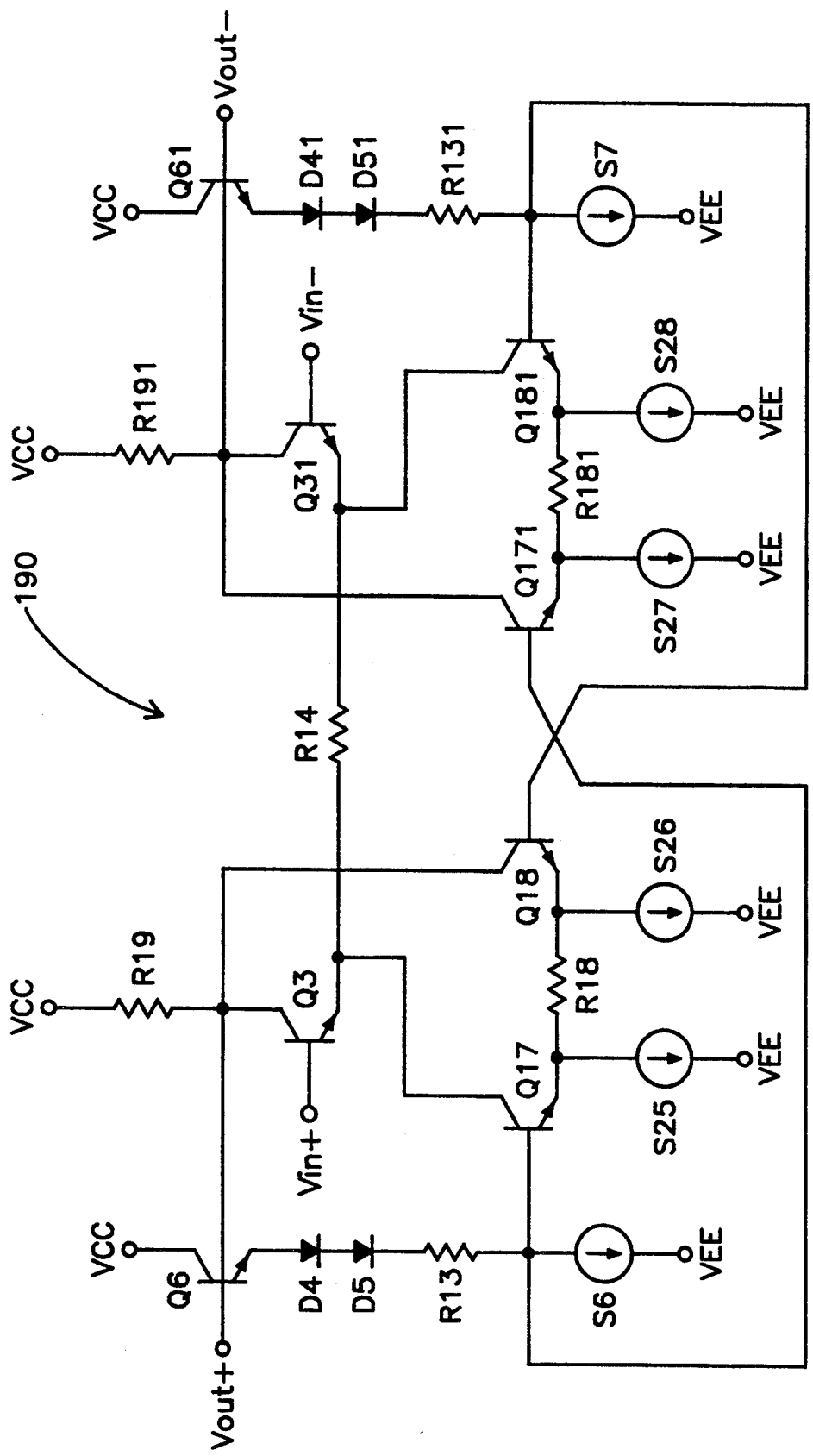
FIG. 26 illustrates another resistively degenerated common-emitter bipolar transistor differential traneconductance amplifier in a resistive load, feedback configuration including the ΔVbe compensation arrangement of FIG. 3.

FIG. 26 illustrates a resistively degenerated common-emitter bipolar transistor differential transconductance circuit 190 in a resistive load configuration, including load resistors R19 and R191 connected to the collectors of the transistors Q3 and Q31 respectively. The resistance of the resistors R19 and R191 is one-half the resistance of the resistors R14, R18 and R181. The circuit 190 utilizes the feedback configuration, with the inputs for the compensation arrangement being the output signals Vout+ and Vout−.

Figure 27:
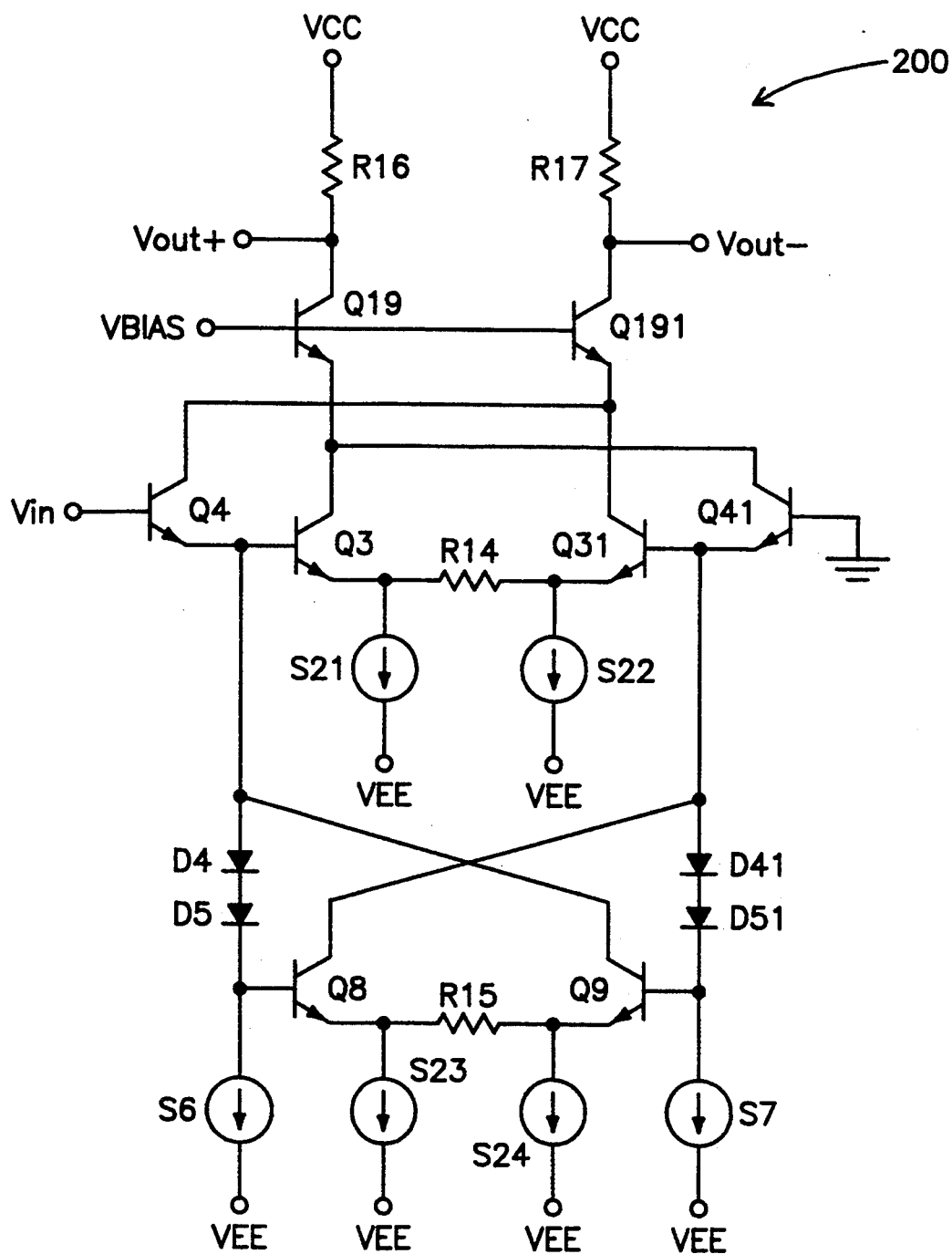
FIG. 27 illustrates a resistively degenerated common-emitter bipolar transistor single-ended to differential converter in a feedforward configuration including the ΔVbe compensation arrangement of FIG. 4.

FIG. 27 illustrates a resistively degenerated common-emitter bipolar transistor single-ended to differential converter circuit 200 in a feedforward configuration. The circuit 200 is similar to the circuit 160 of FIG. 23. However, a single-ended input signal Vin is applied to the base of the transistor Q4, whereas the base of the transistor Q41 is grounded.

The input signals for the ΔVbe compensation arrangement are taken from the emitters of the transistors Q4 and Q41, rather than from separate transistors Q6 and Q61 as in the circuit 160. Thus, the transistors Q4 and Q41 provide pre-distortion ΔVbe compensation for both the main transistors Q3 and Q31 and the compensation transistors Q8 and Q9.

The collectors of transistors Q19 and Q191 are connected to the resistors R16 and R17, and the emitters of the transistors Q19 and Q191 are connected to the collectors of the transistors Q3 and Q31 in a cascode arrangement. A bias voltage VBIAS is applied to the bases of the transistors Q19 and Q191.

The transistors Q4 and Q41 also provide isolation of the transistors Q3 and Q31 from the input signal Vin and ground respectively, and overcome the problem of asymmetry in a single-ended to differential converter which results from the fact that one differential input is subject to modulation and the other input is not (grounded). In addition, the collectors of the transistors Q4 and Q41 are cross-coupled to the collectors of the transistors Q31 and Q3 respectively. The currents in the transistors Q4,Q31 and the currents in the transistors Q41, Q3 are equal and in phase with each other, and are combined by the transistors Q19 and Q191 respectively. Thus, the circuit 200 is capable of providing twice the output current of a conventional differential amplifier or differential single-ended to differential converter.

Figure 28:
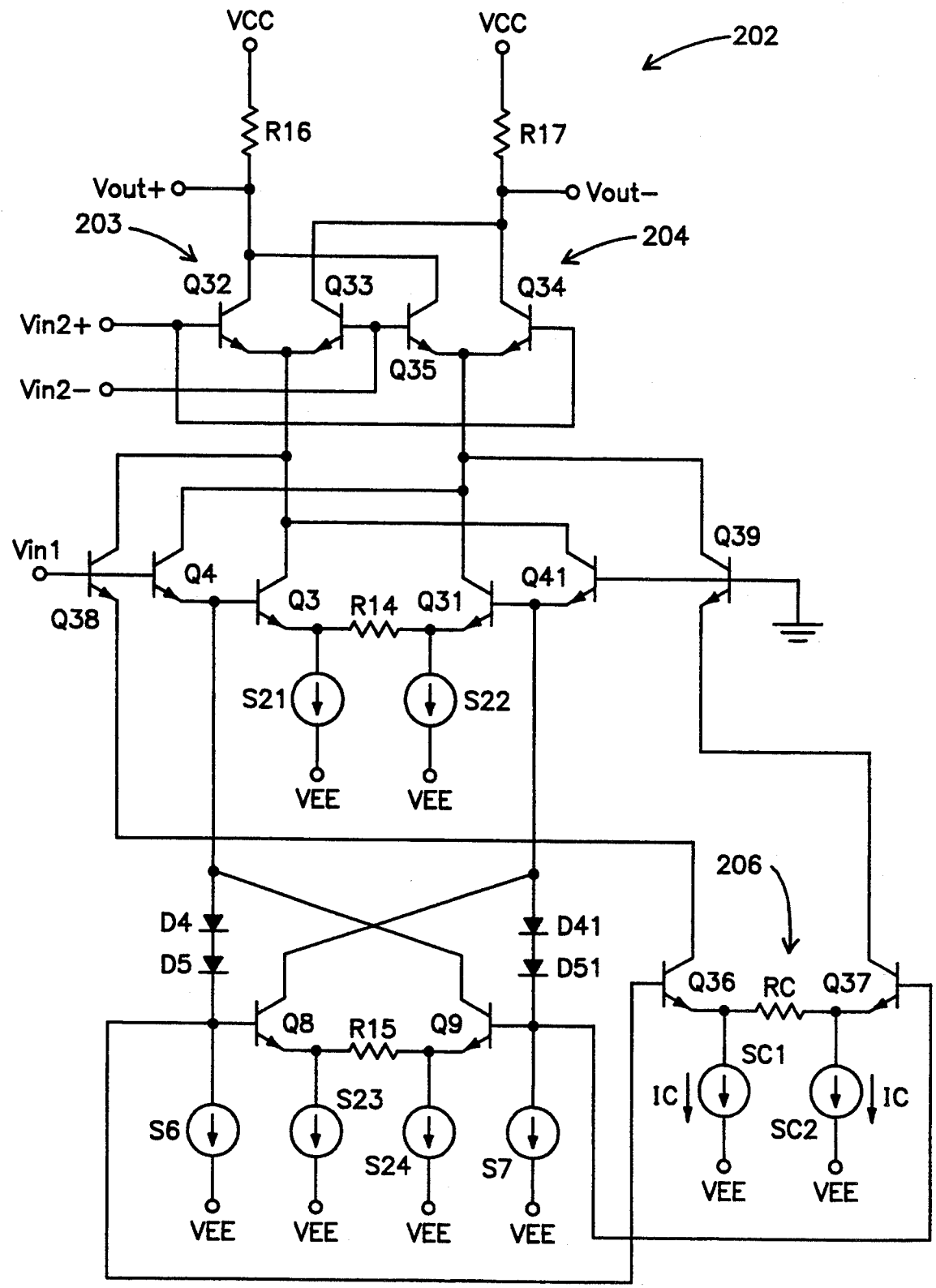
FIG. 28 illustrates a modified version of the circuit of FIG. 27, configured as a Gilbert mixers.

FIG. 28 illustrates how the circuit of FIG. 27 can be modified to constitute a Gilbert mixer circuit 202, which is a critical element in radar and other radio frequency systems. In the circuit 202, the transistors Q19 and Q191 of FIG. 27 are replaced by Gilbert mixers 203 and 204 which enable a differential input signal Vin2+, Vin2− to be mixed with a single-ended input signal Vin1 which is applied to the base of the transistor Q4.

The mixer 203 comprises differentially coupled transistors Q32 and Q33 having bases connected to receive the signals Vin2+ and Vin2− respectively. The emitters of the transistors Q32 and Q33 are connected to the collector of the transistor Q3, whereas the collectors of the transistors are connected to the resistors R16 and R17 respectively. The mixer 204 comprises differentially coupled transistors Q34 and Q35 having bases connected to receive the signals Vin2+ and Vin2− respectively. The emitters of the transistors Q34 and Q35 are connected to the collector of the transistor Q31, whereas the collectors of the transistors Q34 and Q35 are connected to the resistors R17 and R16 respectively. The mixers 203 and 204 sum the input signals Vin2+ and Vin2− with the respective phases of the input signal Vin1.

The circuit 202 further includes a compensating differential amplifier 206 including transistors Q36 and Q37 having bases connected to the bases of the transistors Q8 and Q9 respectively. An emitter degeneration resistor RC is connected between the emitters of the transistors Q36 and Q37. The emitters of the transistors Q36 and Q37 are connected to constant current sources SC1 and SC2 respectively which sink constant currents IC.

The signal Vin1 is also applied to the base of a transistor Q38, the emitter of which is connected to the collector of the transistor Q36. The collector of the transistor Q38 is connected to the collector of the transistor Q3. The base of a transistor Q39 is connected to ground, the emitter of which is connected to the collector of the transistor Q37. The collector of the transistor Q39 is connected to the collector of the transistor Q31.

The transistors Q3S and Q39 and amplifier 206 function to compensate the pre-distortion transistors Q4 and Q41 from instability in the front end of the circuit 202 at the base of the transistor Q4. If the compensation were not provided, as the input signal Vin1 is increased, a signal current would be generated in the transistor Q4 which would flow out of the base thereof. This would undesirably make the input impedance of the amplifier 202 look negative.

The base current flowing out of the transistor Q4 provides the base signal current required by the transistor Q38. The input impedance of the transistor Q38, and thereby of the circuit 202 as seen by the input signal Vin1, can be adjusted by adjusting the change in emitter currents of the transistors Q38 and Q4. If the change in the transistor Q38 equals that of the transistor Q4, the input impedance is theoretically infinite. If the change in the transistor Q38 is larger than that of the transistor Q4, the input impedance has a finite positive value. If the change in the transistor Q38 is smaller than that of the transistor Q4, the input impedance has a finite negative value.

It is also possible, although not shown, to omit the amplifier 206, reduce the value of the resistor R15 by one-half, and replace the transistors Q8 and Q9 with double collector devices. This would provide additional in-phase signal current for the collectors of Q38 and Q39, which is linear since these stages would be pre-distorted.

Figure 29:
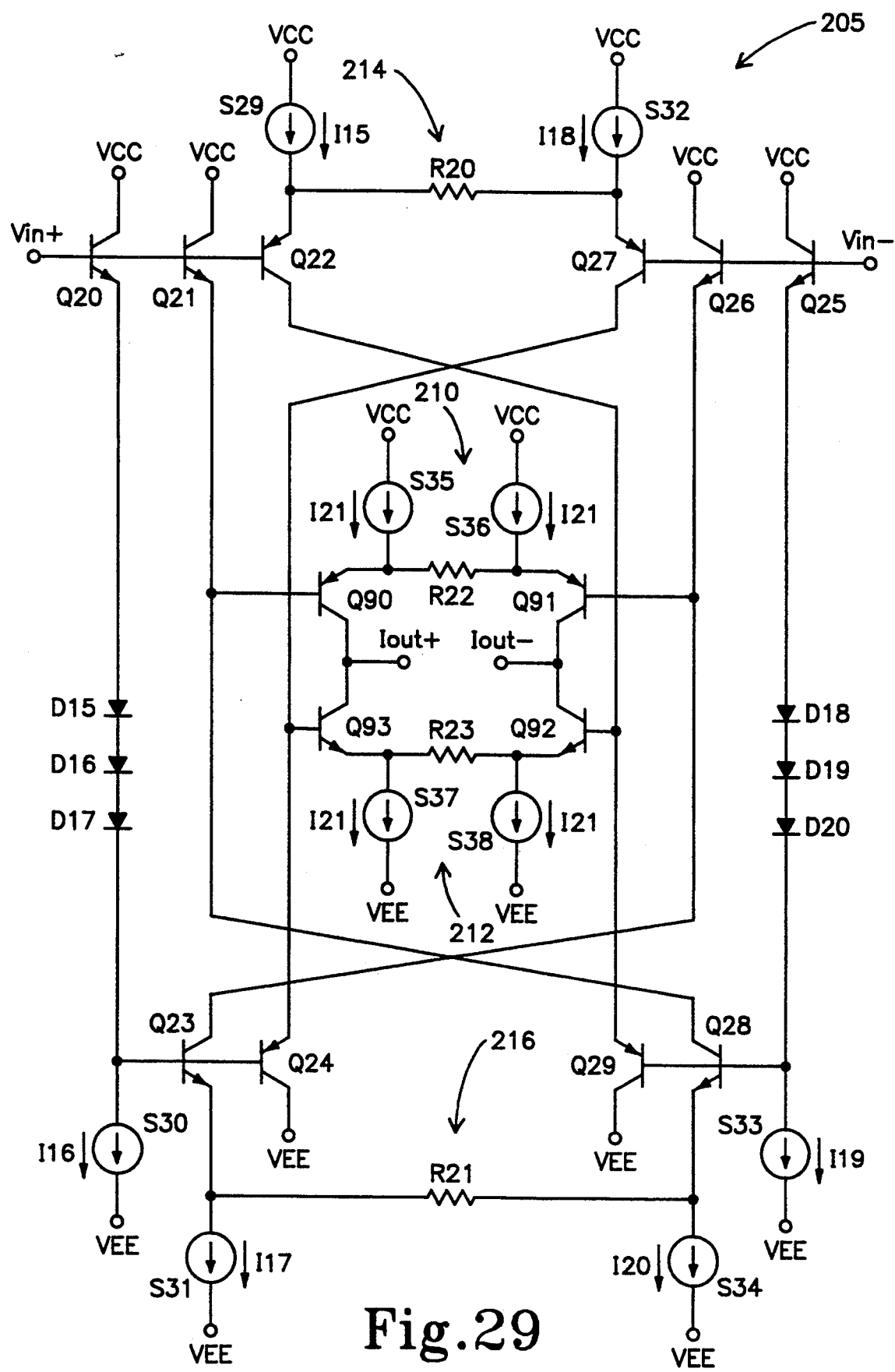
FIG. 29 illustrates a resistively degenerated differential transconductance amplifier circuit utilizing complementary bipolar transistors and having a class A driver amplifier for pre-distortion compensating transistors.
Figure 30:
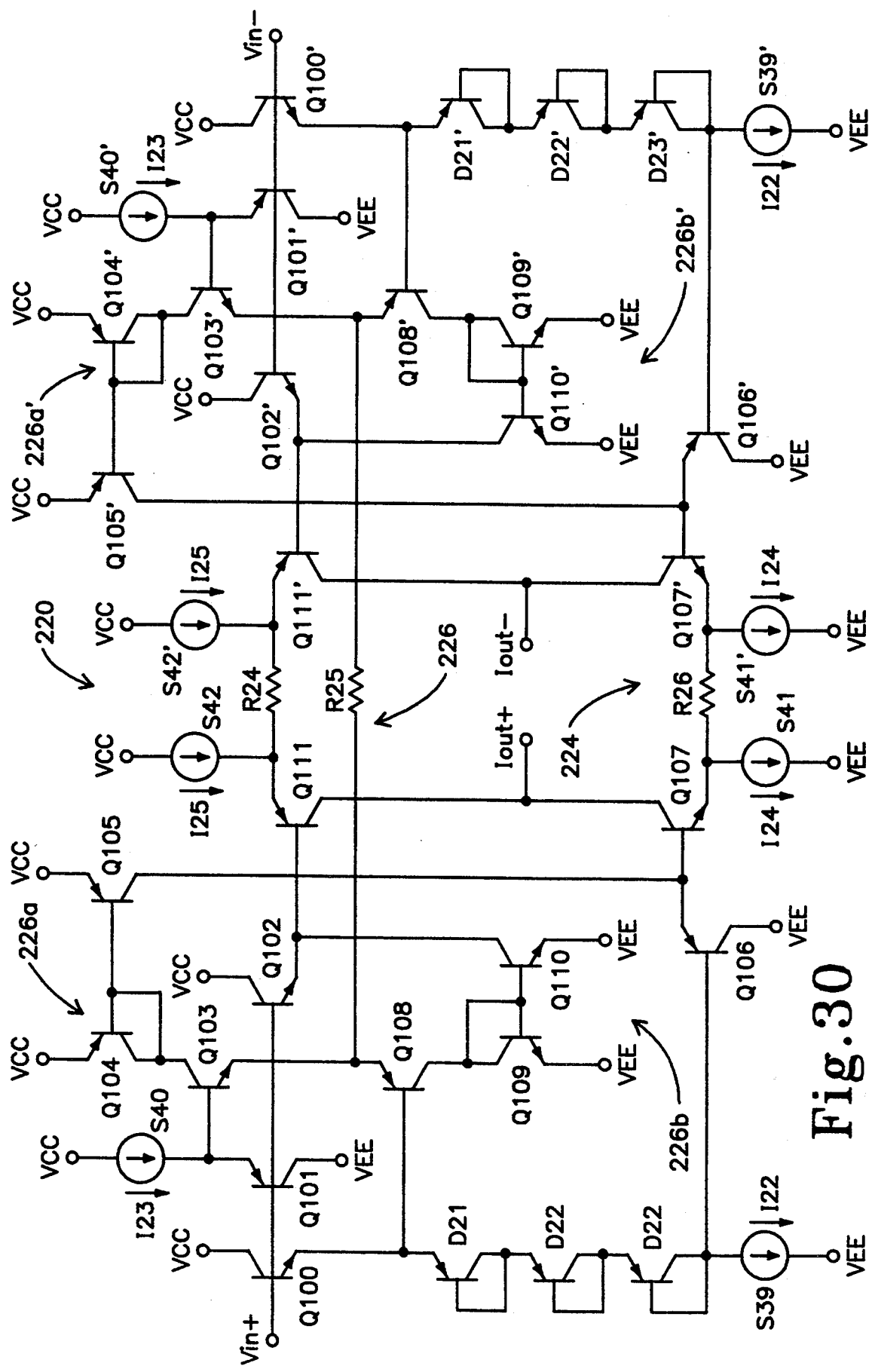
FIG. 30 illustrates a resistively degenerated differential transconductance amplifier utilizing complementary bipolar transistors and having a class AB driver amplifier for pre-distortion compensating transistors.

FIGS. 29 and 30 illustrate how the ΔVbe pre-distortion compensation arrangement of FIG. 4 can be applied to circuits with complementary (both N and P type devices) technologies. Although the examples include bipolar transistors, it will be understood that the techniques are equally applicable to FET circuits.

FIG. 29 illustrates a complementary bipolar, low distortion transconductance differential amplifier circuit 205 which is especially suited for applications such as continuous time filters which require high spur-free dynamic range (SFDR). Typical applications for such continuous time filters include anti-alias filters, high-performance computer disk drives and audio and video recording equipment.

The input signal Vin+ is applied to the bases of NPN bipolar transistors Q20 and Q21, and also to the base of a PNP bipolar transistor Q22. The collectors of the transistors Q20 and Q21 are connected to the source VCC, whereas the emitter of the transistor Q22 is connected to a constant source S29 which sources a current I15. The emitter of the transistor Q20 is connected through level shifting diodes D15, D16 and D17 to a constant current source S30 which sources a constant current I16.

The junction of the diode D17 and source S30 is connected to the bases of an NPN transistor Q23 and a PNP transistor Q24. The emitter of the transistor Q23 is connected to a constant current source S31 which sinks a constant current I17. The collector of the transistor Q24 is connected to the source VEE.

The input signal Vin− is applied to the bases of NPN bipolar transistors Q25 and Q26, and also to the base of a PNP bipolar transistor Q27. The collectors of the transistors Q25 and Q26 are connected to the source VCC, whereas the emitter of the transistor Q27 is connected to a constant source S32 which sources a current I18. The emitter of the transistor Q25 is connected through level shifting diodes D18, D19 and D20 to a constant current source S33 which sources a constant current I19.

The junction of the diode D20 and source S33 is connected to the bases of an NPN transistor Q28 and a PNP transistor Q29. The emitter of the transistor Q28 is connected to a constant current source S34 which sinks a constant current I20. The collector of the transistor Q29 is connected to the source VEE.

An emitter degeneration resistor R20 is connected between the emitters of the transistors Q22 and Q27, whereas an emitter degeneration resistor R21 is connected between the emitters of the transistors Q23 and Q28. The emitter of the transistor Q21 is connected to the base of a PNP transistor Q90 and also to the collector of the transistor Q28, whereas the emitter of the transistor Q26 is connected to the base of a PNP transistor Q91 and also to the collector of the transistor Q23.

The collector of the transistor Q22 is connected to the base of an NPN transistor Q92 and also to the emitter of the transistor Q29, whereas the collector of the transistor Q27 is connected to the base of an NPN transistor Q93 and also to the emitter of the transistor Q24.

An emitter degeneration resistor R22 is connected between the emitters of the transistors Q90 and Q91, whereas an emitter degeneration resistor R23 is connected between the emitters of the transistors Q92 and Q93. Constant current sources S35 and S36 which source constant currents I21 are connected to the junctions of the emitters of the transistors Q90 and Q91 and the resistor R22, whereas constant current sources S37 and S38 which sink constant currents I21 are connected to the junctions of the emitters of the transistors Q92 and Q93 and the resistor R23.

The transistors Q90 and Q91, sources S35 and S36 and resistor R22 constitute a main PNP transconductance amplifier 210, whereas the transistors Q92 and Q93, sources S37 and S38 and resistor R23 constitute a main NPN transconductance amplifier 212. The transistors Q22 and Q27, sources S29 and S32 and resistor R20 constitute a compensating PNP transconductance amplifier 214, whereas the transistors Q23 and Q28, sources S31 and S34 and resistor R21 constitute a compensating NPN transconductance amplifier 216.

The transistors Q21 and Q26 are pre-distortion compensating transistors for the transistors Q90 and Q91 respectively of the PNP main amplifier, whereas the transistors Q24 and Q29 are pre-distortion compensating transistors for the transistors Q93 and Q92 respectively of the main NPN amplifier. The pre-distortion compensating transistors Q21 and Q26 are driven by the amplifier 216, whereas the pre-distortion transistors Q24 and Q29 are driven by the amplifier 214. I Output current signals Iout+ and Iout− are taken at the collectors of the transistors Q90,Q93 and Q91,Q92 respectively. These currents can be converted to output voltages by load resistors (not shown) connected between the outputs Iout+ and Iout− and ground, of a single resistor connected between the outputs Iout+ and Iout−. An integrating output can be generated by connecting a capacitor between the outputs.

In the complementary configuration, the $\Delta Vbe$ of the compensating transistors must increase the $\Delta Vbe$ of the main transistors increases, and vice-versa. This is the opposite of the operation for the all NPN architecture described above. Taking the main transistor Q90 and compensating transistor Q21 as an example, as the input signal Vin+ increases, the current through the transistor Q90 decreases and the $\Delta Vbe$ of the transistor Q90 decreases. The voltage at the emitter of the main transistor Q90 is Vin+ plus the Vbe of the transistor Q90. The voltage at the emitter of the compensating transistor Q21 is vin+ minus the Vbe of the transistor Q21.

In order for the voltage at the emitter of the transistor Q90 to equal Vin+ plus the nominal Vbe of the transistor Q21 minus the nominal Vbe of the transistor Q90, the amplifier 216 must function such that the current through the transistor Q28 and thereby the transistor Q21 decreases, and the $\Delta Vbe$ of the transistor Q21 decreases by the same as the $\Delta Vbe$ of the transistor Q90. In this manner, the Vbe of the transistor is maintained equal to and cancels the Vbe of the transistor Q90, and the emitter voltage of the transistor Q90 ie maintained at Vin+ plus the nominal Vbe of the transistor Q21 minus the nominal Vbe of the transistor Q90. The operation is similar for the other three main and compensating transistors.

Another complementary bipolar, low distortion transconductance differential amplifier circuit 220 is illustrated in FIG. 30. Whereas the circuits described above operate as class A amplifier stages, the circuit 220 includes class AB stages which enable the signal current to be larger than the standing current. The input signal Vin+ is applied to the base of an NPN transistor Q100, the collector of which is connected to the source Vcc. The emitter of the transistor Q100 is connected through level shifting, diode connected NPN transistors D21, D22 and D23 to a constant current source S39 which sinks a constant current I22. The signal Vin+ is also applied to the bases of a PNP transistor Q101 and an NPN transistor Q102.

The collector of the transistor Q101 is connected to the source VEE, whereas the emitter of the transistor Q101 is connected to the base of an NPN transistor Q103 and also to a constant current source S40 which sinks a constant current I23. The collector of the transistor Q103 is connected to the base and collector of a diode-connected PNP transistor Q104 and also to the base of a PNP transistor Q105. The emitters of the transistors Q104 and Q105 are connected to the source Vcc.

The collector of the transistor Q105 is connected to the emitter of a PNP transistor Q106 and to the base of an NPN transistor Q107. The collector of the transistor Q106 is connected to the source VEE, whereas the emitter of the transistor Q107 is connected to a constant current source S41 which sinks a constant current I24.

The emitter of the transistor Q103 is connected to the emitter of a PNP transistor Q108, the base of which is connected to the emitter of the transistor Q100. The collector of the transistor Q108 is connected to the base and collector of a diode connected NPN transistor Q109, the emitter of which is connected to the source VEE. The base of the transistor Q109 is also connected to the base of an NPN transistor Q110, the emitter of which is connected to the source VEE and the collector of which is connected to the emitter of the transistor Q102. The base of a PNP transistor Q111, the emitter of which is connected to a constant current source S42 which sinks a constant current I25. The collector of the transistor Q111 is connected to the collector of the transistor Q107.

The circuit 220 further includes a right half which is essentially similar to the left half described above, in which corresponding elements are designated by the same reference numerals primed. The construction and operation of the right half of the circuit 220 is symmetrical to the left half thereof, and will not be described in detail. The input signal Vin− is applied to the base of the transistor Q100′, whereas the differential output current signals Iout+ and Iout− are taken at the collectors of the transistors Q111, Q107 and Q111′, Q107′ respectively. Emitter degeneration resistors R24, R25 and R26 are connected between the emitters of the transistors Q111,Q111′, Q108 Q108′ and Q107,Q107′ respectively. The resistances of the resistors R24 and R26 are equal, and the resistance of the resistor R25 is one-half that of the resistors R24 and R26.

The transistors Q111 and Q111′ sources S42 and S42′ and resistor R24 constitute a main PNP transconductance amplifier 222. The transistors Q107 and Q107′, sources S41 and S41′ and resistor R26 constitute a main NPN transconductance amplifier 224. The transistors Q102, Q106, Q102′ and Q106′ are pre-distortion compensating transistors for the main transistors Q111, Q107, Q111′ and Q107′ respectively.

The transistors Q103, Q104 and Q105 constitute an PNP unity gain complementary follower 226a, whereas the transistors Q108, Q109 and Q110 constitute an NPN unity gain complementary follower 226b. The follower 226a drives the compensation transistor Q106, whereas the follower 226a drives the compensation transistor Q102. The followers 226a and 226b, in combination with the corresponding elements in the right half of the circuit 220 and the resistor R25 constitute a class AB transconductance amplifier. The compensation transistors Q102, Q106, Q102′ and Q106′ are driven such that their ΔVbe increases by the same amount that the ΔVbe of the respective main transistors Q111, Q107, Q111′ and Q107′ increases, and vice-versa, in the same manner as described above with reference to FIG. 28.

The transistors Q100 and Q101 are drivers for the transistors Q103 and Q108. The transistors Q104 and Q105 constitute a current mirror which reflects a change in the current through the transistor Q103 to the transistor compensating Q106. The transistors Q109 and Q110 constitute a current mirror which reflects a change in the current through the transistor Q108 to the compensating transistor Q102.

While several illustrative embodiments of the invention have been shown and described, numerous variations and alternate embodiments will occur to those skilled in the art, without departing from the spirit and scope of the invention. Accordingly, it ie intended that the present invention not be limited solely to the specifically described illustrative embodiments. Various modifications are contemplated and can be made without departing from the spirit and scope of the invention as defined by the appended claims.

We claim:

1. A differential amplifier circuit, comprising:
   main differential amplifier means including first and second differentially connected main transistors and a transfer function having a non-linear error; and
   differential compensation amplifier means for producing and applying first and second differential compensating current signals to the main differential amplifier means which are equal and opposite to the signal current developed across a degeneration resistor in the main differential amplifier means and which cancel respective current variations in the first and second main transistors caused by said non-linear error respectively thereby maintaining a constant base emitter voltage in the first and second differentially connected main transistors.

2. A differential amplifier circuit, comprising:
   main differential amplifier means including first and second differentially connected main transistors the first and second main transistors connected through a degeneration resistor wherein a signal current is produced across said degeneration resistor in response to an applied input stimulus, and a transfer function having a non-linear error; and
   a resistively degenerated differential compensation amplifier means for producing and applying first and second differential compensating current signals to the main amplifier means which are equal and opposite to and cancel respective current variations in the first and second main transistors caused by said non-linear error respectively; in which the compensating means and generator means are configured such that substantially constant current flows through the first and second main transistors thereby maintaining a constant forward base emitter voltage.

3. A differential amplifier circuit, comprising:
   main differential amplifier means including first and second differentially connected main transistors the first and second main transistors connected through a degeneration resistor wherein a signal current is produced across said degenerating resistor in response to an applied input stimulus, and a transfer function having a non-linear error; and
   a resistively degenerated differential compensation amplifier means for producing and applying first and second differential compensating current signals to the main differential amplifier means which are equal and opposite to and cancel respective current variations in the first and second main transistors caused by said non-linear error respectively; in which the compensating means and generator means are configured such that substantially constant forward base emitter voltage is maintained through the first and second main transistors.

4. A differential amplifier circuit comprising:

a main differential amplifier means for maintaining a constant forward base-emitter voltage including,
   first and second main transistors connected through a degeneration resistor, and
   a signal current produced across said degeneration resistor in response to an applied input stimulus; and
a resistively degenerated compensation means including, a pair of resistively degenerated differential amplifiers, for producing a pair of constant compensating differential current signals to said main differential amplifier means for maintaining a constant forward base-emitter voltage through the first and second main transistors.

* * * * *